US012669727B2

(12) United States Patent
Gao et al.

(10) Patent No.: US 12,669,727 B2
(45) Date of Patent: Jun. 30, 2026

(54) ARRAY SUBSTRATE, MANUFACTURING METHOD THEREFOR, LIGHT-EMITTING DEVICE, AND TILED DISPLAY DEVICE

(71) Applicants: HEFEI BOE PIXEY TECHNOLOGY CO., LTD., Hefei (CN); BOE Technology Group Co., Ltd., Beijing (CN)

(72) Inventors: Liang Gao, Beijing (CN); Hai Tang, Beijing (CN)

(73) Assignees: Hefei BOE Pixey Technology Co., Ltd., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 374 days.

(21) Appl. No.: 18/274,884

(22) PCT Filed: Jul. 1, 2022

(86) PCT No.: PCT/CN2022/103454
§ 371 (c)(1),
(2) Date: Jul. 28, 2023

(87) PCT Pub. No.: WO2023/005609
PCT Pub. Date: Feb. 2, 2023

(65) Prior Publication Data
US 2024/0103316 A1 Mar. 28, 2024

(30) Foreign Application Priority Data

Jul. 30, 2021 (CN) .......................... 202110883921.7

(51) Int. Cl.
*H10H 20/856* (2025.01)
*G02F 1/13357* (2006.01)
(Continued)

(52) U.S. Cl.
CPC .. *G02F 1/133603* (2013.01); *G02F 1/133605* (2013.01); *H10H 20/856* (2025.01);
(Continued)

(58) Field of Classification Search
CPC ......... G02F 1/133603; G02F 1/133605; H01L 25/0753; H10H 20/856; H10H 20/857
See application file for complete search history.

(56) References Cited

U.S. PATENT DOCUMENTS

2016/0252218 A1 9/2016 Fujikawa et al.
2018/0138456 A1* 5/2018 Chung ................. H10K 59/874
(Continued)

FOREIGN PATENT DOCUMENTS

CN 109557721 A 4/2019
CN 110908180 A 3/2020
(Continued)

OTHER PUBLICATIONS

Xiao et al., CN_111370560_A_I, 2020, machine translation (Year: 2020).*
(Continued)

*Primary Examiner* — Tracie Y Green
(74) *Attorney, Agent, or Firm* — WHDA, LLP

(57) ABSTRACT

An array substrate comprises: a device region; and a peripheral region; the device region and the peripheral region each comprise a substrate, and a reflective layer; the device region comprises an interlayer dielectric layer and a plurality of devices, and the interlayer dielectric layer is at least located between the substrate and the reflective layer; the reflective layer has a plurality of hollow regions along the direction perpendicular to the substrate, and the devices are located in the hollow region; the orthographic projection of the portion of the reflective layer located in the device region onto the substrate partially overlaps with the orthographic projection
(Continued)

of the interlayer dielectric layer onto the substrate, the portion of the reflective layer covers the portion of the substrate located in the peripheral region, and the outer contour of the substrate is consistent with the outer contour of a peripheral region of the array substrate.

18 Claims, 14 Drawing Sheets

(51) Int. Cl.
  H10H 20/01      (2025.01)
  H10H 20/857      (2025.01)
  H10W 90/00      (2026.01)

(52) U.S. Cl.
  CPC .......... H10H 20/857 (2025.01); H10W 90/00 (2026.01); H10H 20/0363 (2025.01); H10H 20/0364 (2025.01)

(56)           References Cited

U.S. PATENT DOCUMENTS

| | | | |
|---|---|---|---|
| 2020/0089057 A1 | 3/2020 | Watanabe et al. | |
| 2020/0312883 A1* | 10/2020 | Qu ........................ | H01L 21/486 |
| 2021/0005583 A1 | 1/2021 | Iguchi et al. | |
| 2021/0116623 A1* | 4/2021 | Li ........................... | F21V 13/00 |
| 2022/0299823 A1 | 9/2022 | Li et al. | |
| 2024/0210754 A1 | 6/2024 | Li et al. | |

FOREIGN PATENT DOCUMENTS

| | | |
|---|---|---|
| CN | 111370560 A | 7/2020 |
| CN | 112652697 A | 4/2021 |
| CN | 215896398 U | 2/2022 |
| CN | 114428421 A | 5/2022 |
| EP | 4207291 A1 | 7/2023 |
| JP | 2003-243719 A | 8/2003 |
| WO | 2021/164583 A1 | 8/2021 |

OTHER PUBLICATIONS

Office Action dated Jul. 22, 2025, issued in counterpart CN Application No. 202110883921.7, with English translation. (8 pages).

Extended (Supplementary) European Search Report dated Sep. 16, 2024, issued in counterpart EP Application No. 22848214.7. (9 pages).

Office Action dated Dec. 2, 2025, issued in counterpart EP Patent Application No. 22848214.7 (10 pages).

* cited by examiner

Scratch    Knife mark

Knife mark

S901 providing a mother-board substrate, wherein the mother-board substrate is delimited into at least one device region and a cutting region adjacent to the device region

S902 forming the inter-layer-medium layer within the device region of the mother-board substrate

S903 forming the reflecting layer within the device region and the cutting region of the mother-board substrate, wherein the reflecting layer has a plurality of hollowed-out regions in a direction perpendicular to the mother-board substrate; the inter-layer-medium layer is located at least between the mother-board substrate and the reflecting layer; and an orthographic projection on the mother-board substrate of the part of the reflecting layer that is located within the device region and an orthographic projection of the inter-layer-medium layer on the mother-board substrate partially intersect or overlap, and a part of the reflecting layer that is located within the cutting region covers the cutting region of the mother-board substrate

S904 bonding the plurality of devices within the device region of the mother-board substrate, wherein the devices are located within the hollowed-out regions

S905 cutting at a back face of the mother-board substrate along a cutting line, to obtain at least one instance of the array base plate, wherein the cutting line is located within the cutting region, and the back face refers to a surface of the mother-board substrate that is further from the devices

FIG. 9 cutting line

C1        D

ARRAY SUBSTRATE, MANUFACTURING METHOD THEREFOR, LIGHT-EMITTING DEVICE, AND TILED DISPLAY DEVICE

The present application claims the priority of the Chinese patent application filed on Jul. 30, 2021 before the Chinese Patent Office with the application number of 202110883921.7 and the title of "ARRAY SUBSTRATE, MANUFACTURING METHOD THEREFOR, LIGHT-EMITTING DEVICE, AND TILED DISPLAY DEVICE", which is incorporated herein in its entirety by reference.

TECHNICAL FIELD

The present application relates to the technical field of displaying, and particularly relates to an array base plate and a fabricating method thereof, a light emitting apparatus and a spliced displaying apparatus.

BACKGROUND

With the rapid development of the technique of displaying, display products of Mini LED (Mini Light Emitting Diode) and Micro LED (Micro Light Emitting Diode) have attracted broad attention. One of the advantages of the Micro/Mini LED display products is that they can realize splicing with a large area, i.e., splicing of a plurality of array base plates, thereby obtaining a display product of an extra-large size.

SUMMARY

The embodiments of the present application employ the following technical solutions:

In an aspect, there is provided an array base plate, wherein the array base plate comprises:

a device region; and a peripheral region adjacent to the device region;

both of the device region and the peripheral region comprise a substrate and a reflecting layer located on the substrate;

the device region further comprises an inter-layer-medium layer and a plurality of devices, and the inter-layer-medium layer is located at least between the substrate and the reflecting layer;

the reflecting layer has a plurality of hollow regions in a direction perpendicular to the substrate, and the devices are located within the hollow regions;

an orthographic projection on the substrate of a part of the reflecting layer that is located within the device region and an orthographic projection of the inter-layer-medium layer on the substrate partially overlap, a part of the reflecting layer that is located within the peripheral region covers a part of the substrate that is located within the peripheral region, and an outer contour of the substrate and an outer contour of the peripheral region of the array base plate are the same; and the devices include at least a light emitting device.

In some embodiments of the present application, the reflecting layer comprises a first reflecting sublayer and a second reflecting sublayer, and the second reflecting sublayer is located on one side of the first reflecting sublayer that is further from the substrate;

an orthographic projection of the first reflecting sublayer on the substrate is located within the device region and the peripheral region;

an orthographic projection on the substrate of a part of the first reflecting sublayer that is located within the device region and the orthographic projection of the inter-layer-medium layer on the substrate partially overlap, and the first reflecting sublayer covers the part of the substrate that is located within the peripheral region; and an orthographic projection of the second reflecting sublayer on the substrate is located within the orthographic projection of the first reflecting sublayer on the substrate.

In some embodiments of the present application, the orthographic projection of the second reflecting sublayer on the substrate is located within the device region; and the orthographic projection of the second reflecting sublayer on the substrate and an orthographic projection on the substrate of a part of the first reflecting sublayer that is located within the peripheral region do not overlap.

In some embodiments of the present application, an orthographic projection of the second reflecting sublayer on the substrate is located within the peripheral region and the device region; and an orthographic projection on the substrate of a part of the second reflecting sublayer that is located within the peripheral region and an orthographic projection on the substrate of a part of the first reflecting sublayer that is located within the peripheral region overlap.

In some embodiments of the present application, the first reflecting sublayer and the second reflecting sublayer have equal thicknesses in the direction perpendicular to the substrate.

In some embodiments of the present application, the array base plate further comprises an auxiliary reflecting part; and the auxiliary reflecting part is located on the inter-layer-medium layer, and the auxiliary reflecting part is connected to the reflecting layer.

In some embodiments of the present application, the auxiliary reflecting part comprises a first reflecting part and a second reflecting part, and the first reflecting part and the second reflecting part are of an integral structure;

the hollow regions expose part of area of the inter-layer-medium layer, an orthographic projection of the first reflecting part on the substrate is located within the hollow regions, and directly contacts the inter-layer-medium layer; and the second reflecting part directly contacts a surface of the reflecting layer that is further from the substrate, and an orthographic projection of the second reflecting part on the substrate overlaps with an orthographic projection of the reflecting layer on the substrate.

In some embodiments of the present application, the array base plate further comprises a plurality of packaging units corresponding to the devices, orthographic projections of the packaging units on the substrate cover orthographic projections of the devices on the substrate, and the orthographic projections of the packaging units on the substrate partially overlap with an orthographic projection of the reflecting layer on the substrate.

In some embodiments of the present application, the device region of the array base plate further comprises a buffer layer and a first electrically conductive layer that are sequentially arranged on the substrate, and the inter-layer-medium layer is located on one side of the first electrically conductive layer that is further from the substrate; and the inter-layer-medium layer comprises a first insulating layer and a first planarization layer, and the first planarization layer is located at least between the first insulating layer and the reflecting layer.

In some embodiments of the present application, the device region of the array base plate further comprises a second electrically conductive layer, a second insulating layer, a second planarization layer and a third insulating layer that are arranged sequentially in stack on the buffer layer, and the third insulating layer is located on one side of the first electrically conductive layer that is further from the first insulating layer.

In some embodiments of the present application, the first electrically conductive layer comprises at least one first bonding pad and at least one second bonding pad, the inter-layer-medium layer has at least one first opening and at least one second opening in the direction perpendicular to the substrate, the first opening exposes a region where the first bonding pad is located, and the second opening exposes a region where the second bonding pad is located; and the first bonding pad is electrically connected to a first weld leg of one of the devices by the first opening, and the second bonding pad is electrically connected to a second weld leg of the device by the second opening.

In some embodiments of the present application, the array base plate further comprises a plurality of supporting columns, the supporting columns are located on one side of the reflecting layer that is further from the substrate, and orthographic projections of the supporting columns on the substrate and orthographic projections of the devices on the substrate do not overlap.

An embodiment of the present application further provides a light emitting apparatus, wherein the light emitting apparatus comprises the array base plate stated above.

In some embodiments of the present application, the light emitting apparatus further comprises a diffuser plate, a quantum-dot film, a diffuser sheet and a composite film that are arranged sequentially in stack; and the diffuser plate is located on a light exiting side of the array base plate.

An embodiment of the present application further provides a spliced displaying apparatus, wherein the spliced displaying apparatus comprises at least two light emitting apparatuses stated above.

An embodiment of the present application further provides a method for fabricating an array base plate, wherein the method is applied to fabricating the array base plate stated above, and the method comprises:

providing a mother-board substrate, wherein the mother-board substrate is delimited into at least one device region and a cutting region adjacent to the device region;

forming the inter-layer-medium layer within the device region of the mother-board substrate;

forming the reflecting layer within the device region and the cutting region of the mother-board substrate, wherein the reflecting layer has a plurality of hollow regions in a direction perpendicular to the mother-board substrate; the inter-layer-medium layer is located at least between the mother-board substrate and the reflecting layer; and an orthographic projection on the mother-board substrate of the part of the reflecting layer that is located within the device region and an orthographic projection of the inter-layer-medium layer on the mother-board substrate partially overlap, and a part of the reflecting layer that is located within the cutting region covers the cutting region of the mother-board substrate;

bonding the plurality of devices within the device region of the mother-board substrate, wherein the devices are located within the hollow regions; and cutting at a back side of the mother-board substrate along a cutting line, to obtain at least one instance of the array base plate, wherein the cutting line is located within the cutting region, and the back side refers to a surface of the mother-board substrate that is further from the devices.

In some embodiments of the present application, after the step of cutting at the back side of the mother-board substrate along the cutting line, to obtain at least one instance of the array base plate, the method further comprises:

grinding an edge of the array base plate by using a perpendicular grinding technique.

In some embodiments of the present application, the step of grinding the edge of the array base plate by using the perpendicular grinding technique comprises:

in a direction perpendicular to the array base plate, grinding a side of the substrate and a side of the reflecting layer of the array base plate simultaneously, wherein the side of the substrate and the side of the reflecting layer are coplanar.

In some embodiments of the present application, the step of forming the reflecting layer within the device region and the cutting region of the mother-board substrate comprises:

forming a first reflecting sublayer, wherein an orthographic projection of the first reflecting sublayer on the mother-board substrate is located within the device region and the cutting region; and forming a second reflecting sublayer, wherein an orthographic projection of the second reflecting sublayer on the mother-board substrate is located within the device region;

or forming a first reflecting sublayer, wherein an orthographic projection of the first reflecting sublayer on the mother-board substrate is located within the device region and the cutting region; and forming a second reflecting sublayer, wherein an orthographic projection of the second reflecting sublayer on the mother-board substrate is located within the device region and the cutting region.

In some embodiments of the present application, after the step of bonding the plurality of devices within the device region of the mother-board substrate, and before the step of cutting at the back side of the mother-board substrate along the cutting line, to obtain at least one instance of the array base plate, the method further comprises:

forming an auxiliary reflecting part on the inter-layer-medium layer, wherein the auxiliary reflecting part is connected to the reflecting layer.

The above description is merely a summary of the technical solutions of the present application. In order to more clearly know the elements of the present application to enable the implementation according to the contents of the description, and in order to make the above and other purposes, features and advantages of the present application more apparent and understandable, the particular embodiments of the present application are provided below.

BRIEF DESCRIPTION OF THE DRAWINGS

In order to more clearly illustrate the technical solutions of the embodiments of the present application or the related art, the figures that are required to describe the embodiments or the related art will be briefly described below. Apparently, the figures that are described below are merely embodiments of the present application, and a person skilled in the art can obtain other figures according to these figures without paying creative work.

FIG. 9 is a flow chart of a method for fabricating an array base plate according to an embodiment of the present application;

FIG. 12b is a schematic diagram of the position of the cutting line corresponding to the cutting process in FIG. 12a;

FIG. 13b is a schematic diagram of the position of the cutting line corresponding to the cutting process in FIG. 13a;

FIGS. 15b and 15c are two schematic structural diagrams of the ground region of the array base plate fabricated by using the grinding process in FIG. 15a;

DETAILED DESCRIPTION

Figure 1A:
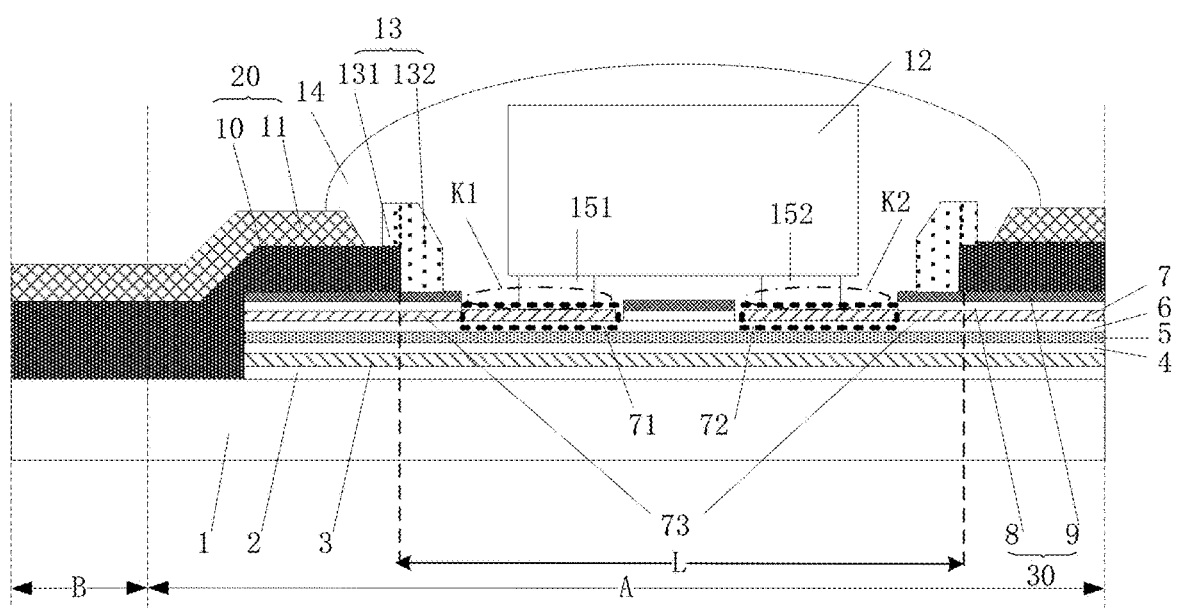
FIG. 1a to FIG. 5 are schematic structural diagrams of nine types of the array base plate according to the embodiments of the present application.

The technical solutions of the embodiments of the present application will be clearly and completely described below with reference to the drawings of the embodiments of the present application. Apparently, the described embodiments are merely certain embodiments of the present application, rather than all of the embodiments. All of the other embodiments that a person skilled in the art obtains on the basis of the embodiments of the present application without paying creative work fall within the protection scope of the present application.

Unless stated otherwise in the context, throughout the description and the claims, the term "comprise" is interpreted as the meaning of opened containing, i.e., "including but not limited to". In the description of the present disclosure, the terms "one embodiment", "some embodiments", "exemplary embodiments", "example", "specific example" or "some examples" are intended to indicate that specific features, structures, materials or characteristics related to the embodiment or example are comprised in at least one embodiment or example of the present disclosure. The illustrative indication of the above terms does not necessarily refer to the same one embodiment or example. Moreover, the specific features, structures, materials or characteristics may be comprised in any one or more embodiments or examples in any suitable manner.

In the embodiments of the present application, unless stated otherwise, the meaning of "plurality of" is "two or more". The terms that indicate orientation or position relations, such as "upper", are based on the orientation or position relations shown in the drawings, and are merely for conveniently describing the present application and simplifying the description, rather than indicating or implying that the component or element must have the specific orientation and be constructed and operated according to the specific orientation. Therefore, they should not be construed as a limitation on the present application.

In order to facilitate the clear description on the technical solutions of the embodiments of the present application, in the embodiments of the present application, terms such as "first" and "second" are used to distinguish identical items or similar items that have substantially the same functions and effects, and a person skilled in the art can understand that the terms such as "first" and "second" do not limit the quantity.

The exemplary embodiments are described herein with reference to sectional views and/or plan views as idealized illustrative figures. In the drawings, in order for clarity, the thicknesses of the layers and the regions are exaggerated. Therefore, alterations from the shapes of the figures as the result of, for example, fabricating techniques and/or tolerances can be envisaged. Therefore, the exemplary embodiments should not be interpreted as limited to the shapes of the regions shown herein, but should include the shape deviations caused by, for example, fabrication. For example, an etching region illustrated as rectangular generally has a curved feature. Therefore, the regions shown in the drawings are essentially illustrative, and their shapes are not intended to illustrate the practical shapes of the regions of the device, and are not intended to limit the scopes of the exemplary embodiments.

Figures 2A, 2B:
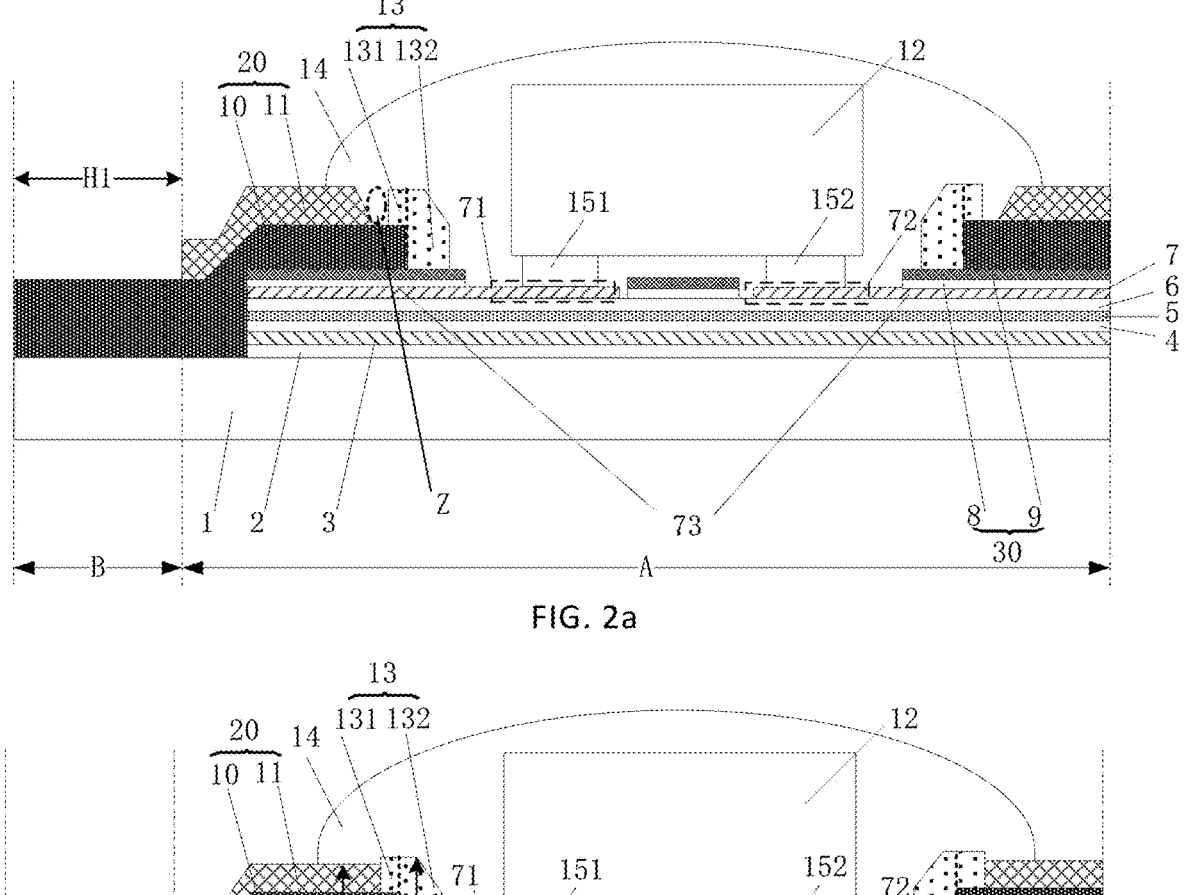
Figure 2C:
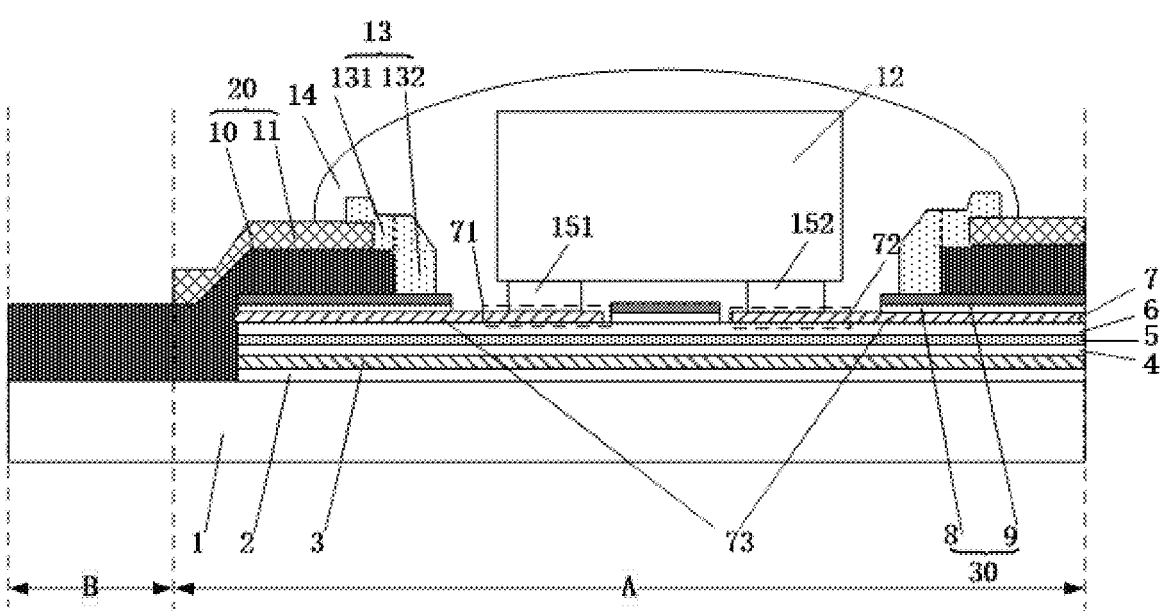
Figure 2D:
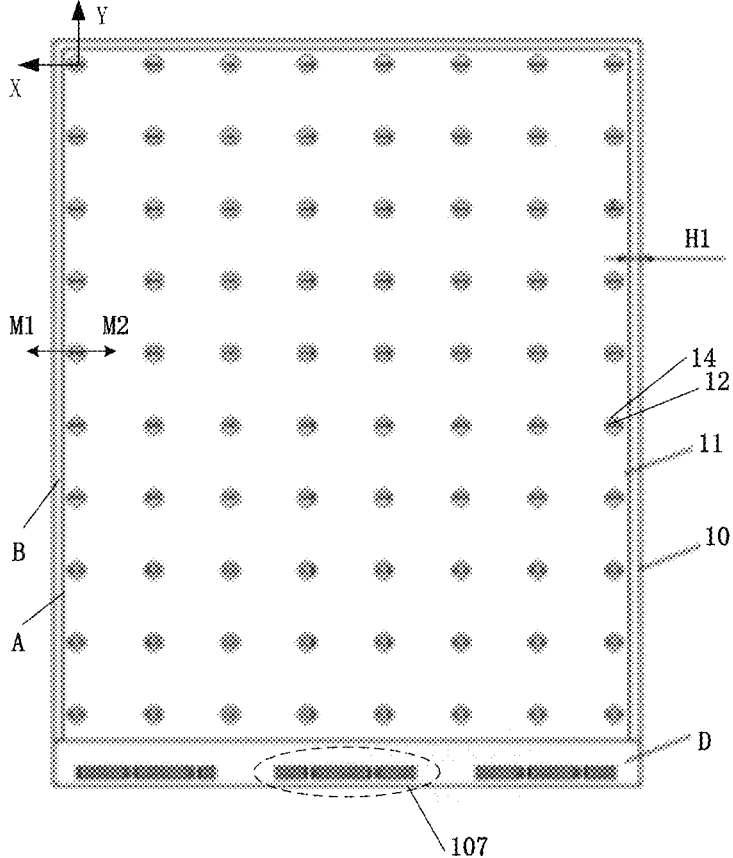

An embodiment of the present application provides an array base plate. Referring to FIG. 1a or 2a, the array base plate comprises:

a device region A; and a peripheral region B adjacent to the device region A shown in FIG. 2d. Both of the device region A and the peripheral region B comprise a substrate 1 and a reflecting layer 20 located on the substrate 1.

The device region A further comprises an inter-layer-medium layer 30 and a plurality of devices 12, and the inter-layer-medium layer 30 is located at least between the substrate 1 and the reflecting layer 20. The reflecting layer 20 has a plurality of hollow regions L in the direction perpendicular to the substrate 1, and the devices 12 are located within the hollow regions L.

An orthographic projection on the substrate 1 of a part of the reflecting layer 20 that is located within the device region A and an orthographic projection of the inter-layer-medium layer 30 on the substrate 1 partially overlap, a part of the reflecting layer 20 that is located within the peripheral region B covers a part of the substrate 1 that is located within the peripheral region B, and the outer contour of the substrate 1 and the outer contour of the peripheral region B of the array base plate are the same.

Multiple types of devices 12 arranged in an array are provided within the device region A of the array base plate. The devices 12 include at least a light emitting device, and may further include any one of sensing devices, minisized driving chips and other types of devices. It can be understood that the different types of devices have unequal quantities, or the different types of devices have unequal densities of the array arrangement.

The peripheral region B refers to the region between the device region A and the boundary of the array base plate. In the practical production process, a plurality of array base plates are formed by cutting a mother board; in other words, the size of the peripheral region B may be decided according to the practical cutting process.

It should be noted that the width of the peripheral region B refers to the spacing between the boundary of the array base plate and the device region A. The value range of the widths at the positions of the peripheral region B is 0.2 mm-2 mm. For example, they may be 0.2 mm, 1 mm, 1.2 mm, 1.5 mm or 2 mm.

In the array base plate, referring to FIG. 1a or 2a, if the bonding region is not taken into consideration, the region other than the peripheral region B is the device region A.

Regarding any one of the devices 12 that is closest to the boundary of the array base plate, the range of the distance between the geometric center of its orthographic projection on the substrate 1 and the edge of the array base plate (the outer contour of the peripheral region B) in the direction parallel to the plane where the substrate 1 is located is 1 mm-5 mm. For example, the distance may be 1 mm, 1.2 mm, 1.5 mm, 2 mm, 3 mm, 4 mm and 5 mm.

As an example, referring to FIG. 2d, the distance between the geometric center of the orthographic projection on the substrate 1 of the device 12 located at the top left corner of the array base plate and the edge of the array base plate in the direction X is 4 mm, and the distance between the outer contour of the device region A and the outer contour of the peripheral region B in the direction X is 0.7 mm. The distance between the geometric center of the orthographic projection on the substrate 1 of the device 12 located at the top left corner of the array base plate and the edge of the array base plate in the direction Y is 2 mm or 3 mm, and the distance between the outer contour of the device region A and the outer contour of the peripheral region B in the direction Y is 0.7 mm. In other words, all of the devices on the array base plate are located within the area where device region A is located.

The substrate 1 may be a rigid substrate. The material of the rigid substrate may be any one of glass, quartz, PET, plastic and so on. The thickness of the rigid substrate may be 0.2 mm-1 mm. As an example, the thickness of the rigid substrate is 0.2 mm, 0.4 mm, 0.5 mm, 0.7 mm or 1 mm.

The light emitting device may be a Mini Light Emitting Diode (abbreviated as Mini LED) or Micro Light Emitting Diode (abbreviated as Micro LED), which is not limited herein.

As an example, all of the plurality of devices 12 may be Mini Light Emitting Diodes or Micro Light Emitting Diodes that emit a blue light. Alternatively, the plurality of devices 12 may include all of three types of light emitting diodes or Micro Light Emitting Diodes emitting a red light, emitting a green light and emitting a blue light.

Because the light rays emitted by the light emitting devices are emitted to the periphery, the reflecting layer 20 can reflect the light rays emitted by the light emitting devices to the light-exiting surface of the array base plate, to increase the light utilization ratio of the light emitting devices.

As an example, the color of the reflecting layer 20 is the white color, so that the reflecting layer 20 has a high reflectivity.

In some embodiments, the reflecting layer 20 may be of a sheet-like structure having a plurality of hollow regions L. Alternatively, the reflecting layer 20 may also be fabricated on the array base plate by sputtering, film coating, spread coating and so on.

As an example, the material of the reflecting layer 20 may comprise a white ink. The components of the white ink include a resin (for example, an epoxy resin and a polytetrafluoroethylene resin), titanium dioxide (with the chemical formula of $TiO_2$), an organic solvent (for example, dipropylene glycol methyl ether) and so on.

The material of the reflecting layer 20 may also comprise a silicon-based white glue. When the material of the reflecting layer 20 comprises the white ink or comprises the silicon-based white glue, the reflecting layer 20 may be formed by printing by using a screen-printing process, or the reflecting layer 20 may be formed by ejection and spread coating by using a rubber-valve spray-coating process.

As an example, referring to FIG. 2b, the range of the distance T1 between the surface of the reflecting layer 20 that contacts the inter-layer-medium layer 30 and the surface of the reflecting layer 20 that is further from the inter-layer-medium layer 30 may be 10 μm-300 μm. For example, the thickness may be 10 μm, 50 μm, 55 μm, 60 μm, 80 μm, 155 μm, 200 μm or 300 μm.

As an example, the reflecting layer 20 may be formed by one time or multiple times of screen printing.

If the reflecting layer 20 is fabricated by multiple times of screen printing, the part of the reflecting layer 20 that is located at the edges of the hollow region L may be of a step shape.

As an example, the shape of the orthographic projection of the hollow region L on the substrate 1 may be a circle, a triangle, a rectangle and so on.

The part of an electrically conductive pattern on the substrate 1 that is exposed by the hollow region L on the reflecting layer 20 is used to be connected to the device 12, and the part of the electrically conductive pattern that is covered by the reflecting layer 20 is used to be connected to an external signal-source circuit, so as to receive and transmit an electric signal from and to the device 12.

That the inter-layer-medium layer 30 is located at least between the substrate 1 and the reflecting layer 20 means that, referring to FIG. 1a, within the region of the array base plate where no device 12 is provided, the inter-layer-medium layer 30 is located between the substrate 1 and the reflecting layer 20, and within the hollow region L, part of the region between the electrically conductive patterns (for example, between the electrically conductive bonding pads 71, 72) is provided with part of the inter-layer-medium layer 30, and that part of the inter-layer-medium layer 30 is located between the substrate 1 and the device 12.

Referring to FIG. 1a, the inter-layer-medium layer 30 has at least one first opening K1 and at least one second opening K2 in the direction perpendicular to the substrate 1. The orthographic projections on the substrate 1 of the first opening K1 and/or the second opening K2 are located within the area of the orthographic projection of the hollow region L on the substrate 1.

The first openings K1 in the inter-layer-medium layer 30 expose part of the electrically conductive pattern provided on the substrate 1, and the second openings K2 in the inter-layer-medium layer 30 expose the other part of the electrically conductive pattern provided on the substrate 1, whereby the device 12 is connected to the electrically conductive pattern, and the electrically conductive pattern is connected to the external signal-source circuit so as to receive an electric signal.

In some embodiments, both of the device region A and the peripheral region B are provided with the reflecting layer 20. As an example, referring to FIG. 1a or 2a, the orthographic projection of the reflecting layer 20 on the array base plate does not overlap with the hollow region L.

As an example, the part of the reflecting layer 20 that is provided within the device region A is located on the side of the inter-layer-medium layer 30 that is further from the substrate 1, and, according to the difference in the materials and/or the fabricating processes of the reflecting layer 20, the orthographic projection of the reflecting layer 20 on the substrate 1 and the orthographic projection of the inter-layer-medium layer 30 on the substrate 1 have different cases of overlapping.

For example, if the reflecting layer 20 is fabricated by multiple times of screen printing, the boundaries of the reflecting layer 20 that are located within the hollow region L are of a step shape, and the part of the inter-layer-medium layer 30 that is located within the hollow region L is not covered by the reflecting layer 20.

Figures 3, 4:
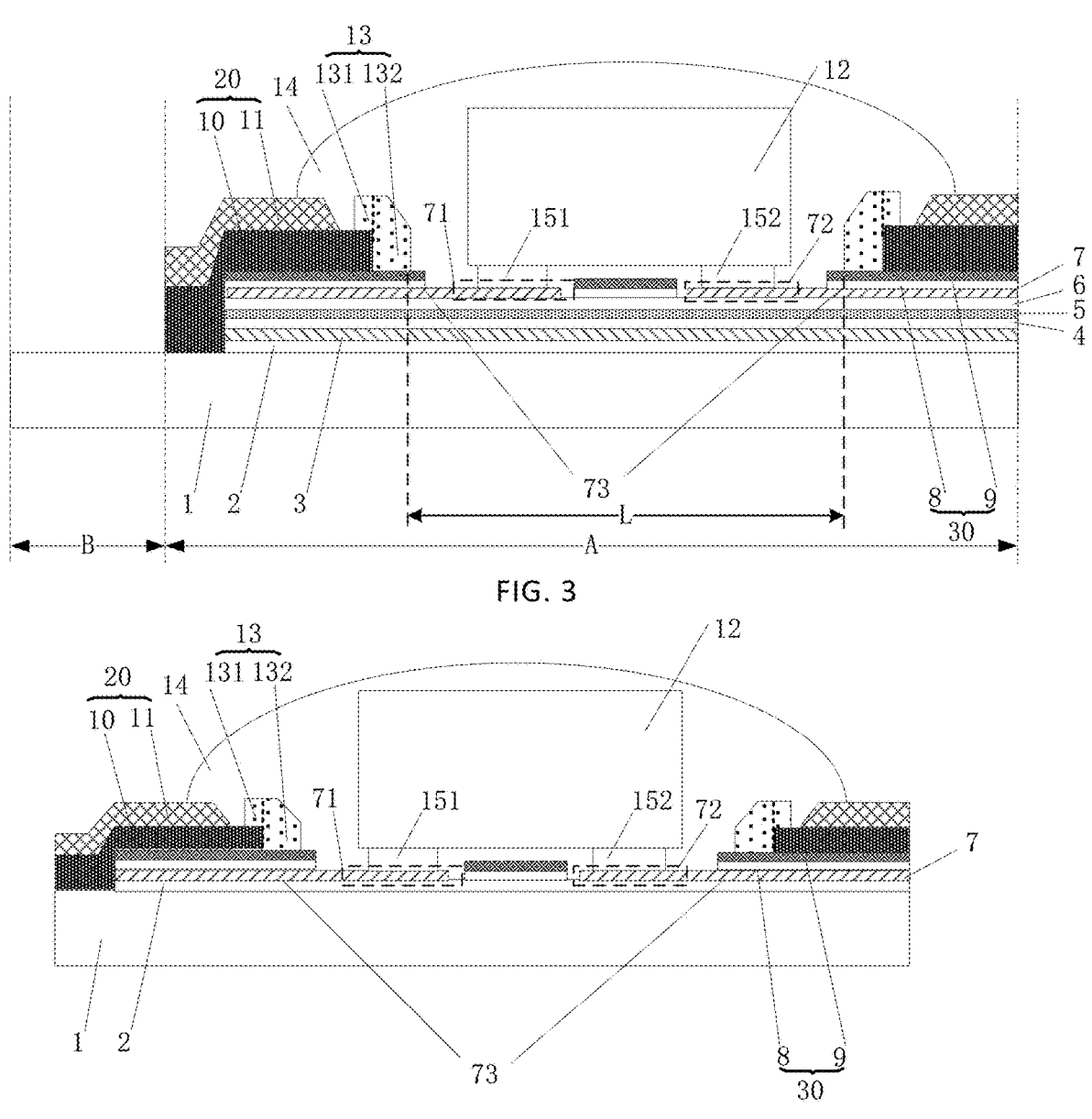

FIG. 3 shows a schematic structural diagram of an array base plate in which the reflecting layer 20 is not provided within the peripheral region B of the substrate 1. Referring to FIG. 3, the reflecting layer 20 covers nearly all of the areas of the device region A of the array base plate other than the hollow region L, but does not cover the peripheral region B of the substrate 1. When the array base plate shown in FIG. 3 is emitting light, the peripheral region B has no device 12, and has no reflecting layer 20 to reflect light rays, so as to present a relatively dark visual effect, i.e., a poor effect of light emission.

In the array base plate shown in FIG. 1a or FIG. 2a according to the embodiments of the present application, because the outer contour of the peripheral region B of the array base plate is exactly the outer contour of the substrate 1, and the part of the reflecting layer 20 that is located within the peripheral region B covers the peripheral region B of the substrate 1, the part of the reflecting layer 20 that is located within the peripheral region B can extend to the outer contour of the substrate 1. Therefore, when the array base plate is emitting light, the reflecting layer 20 within peripheral region B can reflect the light rays that are emitted by the device region A and enter its surface, which ameliorates to a large extent the problem of a high difference in the optical brightnesses of the peripheral region B and the device region A of the array base plate, and can increase the light-emission amount of the array base plate in the direction perpendicular to the plane where the substrate 1 is located, thereby increasing the luminous efficiency of the array base plate.

In some embodiments of the present application, referring to FIG. 1a or FIG. 2a, the reflecting layer 20 comprises a first reflecting sublayer 10 and a second reflecting sublayer 11, and the second reflecting sublayer 11 is located on the side of the first reflecting sublayer 10 that is further from the substrate 1. An orthographic projection of the first reflecting sublayer 10 on the substrate 1 is located within the device region A and the peripheral region B.

An orthographic projection on the substrate 1 of a part of the first reflecting sublayer 10 that is located within the device region A and the orthographic projection of the inter-layer-medium layer 30 on the substrate 1 partially overlap, and the first reflecting sublayer 10 further covers the substrate 1 within the peripheral region B.

An orthographic projection of the second reflecting sublayer 11 on the substrate 1 is located within the orthographic projection of the first reflecting sublayer 10 on the substrate 1.

In some embodiments, referring to FIG. 1a, part of the inter-layer-medium layer 30 between the device 12 and the substrate 1 is not required to be provided with the reflecting layer 20, and the inter-layer-medium layer 30 outside the region where the device 12 is located is provided with the reflecting layer 20, whereby the orthographic projection of the reflecting layer 20 on the substrate 1 and the orthographic projection of the inter-layer-medium layer 30 on the substrate 1 partially overlap.

In some embodiments, an orthographic projection on the substrate 1 of a part of the first reflecting sublayer 10 that is located within the device region A and the orthographic projection of the inter-layer-medium layer 30 on the substrate 1 partially overlap. However, in the practical fabricating process, because of the process errors, in part of the region of the array base plate, the first reflecting sublayer 10 in the reflecting layer 20 may extend in the direction from the first reflecting sublayer 10 pointing to the device 12, so that the first reflecting sublayer 10 covers the part of the inter-layer-medium layer 30 that is located within the hollow region L and does not overlap with the orthographic projection of the device 12 on the substrate 1 shown in FIG. 1a.

In some embodiments, an orthographic projection of the second reflecting sublayer 11 on the substrate 1 is located within the orthographic projection of the first reflecting sublayer 10 on the substrate 1.

As an example, referring to FIG. 1a, the orthographic projection of the second reflecting sublayer 11 on the substrate 1 is located within the device region A and the peripheral region B, the orthographic projection on the substrate 1 of the part of the second reflecting sublayer 11 that is provided within the device region A is located within the orthographic projection on the substrate 1 of the part of the first reflecting sublayer 10 that is provided within the device region A, and the orthographic projection on the substrate 1 of the part of the second reflecting sublayer 11 that is located within the peripheral region B and the orthographic projection on the substrate 1 of the part of the first reflecting sublayer 10 that is located within the peripheral region B overlap.

Alternatively, the orthographic projection of the second reflecting sublayer 11 on the substrate 1 is located within the device region A and the peripheral region B, the orthographic projection on the substrate 1 of the part of the second reflecting sublayer 11 that is provided within the device region A is located within the orthographic projection on the substrate 1 of the part of the first reflecting sublayer 10 that is provided within the device region A, and the orthographic projection on the substrate 1 of the part of the second reflecting sublayer 11 that is provided within the peripheral region B is located within the orthographic projection on the substrate 1 of the part of the first reflecting sublayer 10 that is provided within the peripheral region B.

Alternatively, referring to FIG. 2a, the orthographic projection of the second reflecting sublayer 11 on the substrate 1 is located within the device region A, the peripheral region B is not provided with the second reflecting sublayer 11, and the orthographic projection of the second reflecting sublayer 11 on the substrate 1 is located within the orthographic projection on the substrate 1 of the part of the first reflecting sublayer 10 that is provided within the device region A.

In some embodiments, the orthographic projection of the first reflecting sublayer 10 on the substrate 1 may be located within the orthographic projection of the second reflecting sublayer 11 on the substrate 1. The figures according to the embodiments of the present application illustrate by taking the case as an example in which the orthographic projection of the second reflecting sublayer 11 on the substrate 1 is located within the orthographic projection of the first reflecting sublayer 10 on the substrate 1.

In some embodiments, referring to FIG. 2a, the first reflecting sublayer 10 covers the edge of the substrate 1, and the second reflecting sublayer 11 contracts inwardly toward the device region A, whereby the range of the distance H1 between the edge of the second reflecting sublayer 11 and the edge of the substrate 1 is controlled to be between 0.2-2 mm.

As an example, the distance H1 between the edge of the second reflecting sublayer 11 and the edge of the substrate 1 may be 0.2 mm, 0.4 mm, 0.5 mm, 0.8 mm, 1 mm, 1.5 mm, 1.8 mm or 2 mm. The particular numerical value of the distance H1 between the edge of the second reflecting sublayer 11 and the edge of the substrate 1 may be decided according to the different configurations of the array base plate and according to the different fabricating processes or cutting processes of the array base plate.

In some embodiments, referring to FIG. 2d, FIG. 2d shows a top view of an array base plate, wherein FIG. 2a is a cross-sectional view of FIG. 2d along M1M2. As shown in FIG. 2d, the plurality of devices 12 are arranged in an array within the device region A, the reflecting layer 20 within the device region A comprises the first reflecting sublayer 10 and the second reflecting sublayer 11, and the reflecting layer 20 within the peripheral region B comprises the first reflecting sublayer 10. In FIG. 2d merely the second reflecting sublayer 11 located at the surface of the device region A can be seen. Moreover, the first reflecting sublayer 10 covers the edge of the substrate 1 that is located within the peripheral region B, and the second reflecting sublayer 11 contracts inwardly toward the device region A, whereby the range of the distance H1 between the edge of the second reflecting sublayer 11 and the edge of the substrate 1 is controlled to be between 0.2-2 mm. The devices 12 shown in FIG. 2d are light emitting devices.

In some embodiments, the materials of the first reflecting sublayer 10 and the second reflecting sublayer 11 may be different. For example, the material of the first reflecting sublayer 10 may comprise a white ink, and the material of the second reflecting sublayer 11 may comprise a silicon-based white glue. Alternatively, the material of the first reflecting sublayer 10 may comprise a white ink, and the material of the second reflecting sublayer 11 may comprise a reflector plate.

Alternatively, the materials of the first reflecting sublayer 10 and the second reflecting sublayer 11 may be the same. For example, both of the materials of the first reflecting sublayer 10 and the second reflecting sublayer 11 comprise a white ink. When the materials of the first reflecting sublayer 10 and the second reflecting sublayer 11 comprise a white ink or comprise a silicon-based white glue, the first reflecting sublayer 10 and the second reflecting sublayer 11 may be formed by printing by using a screen-printing process.

As an example, the range of the thickness of the first reflecting sublayer 10 in the direction perpendicular to the substrate 1 may be 25 μm-35 μm, for example, 25 μm, 28 μm, 30 μm, 32 μm or 35 μm.

As an example, the range of the thickness of the second reflecting sublayer 11 in the direction perpendicular to the substrate 1 may be 25 μm-35 μm, for example, 25 μm, 28 μm, 30 μm, 32 μm or 35 μm.

In some embodiments of the present application, referring to FIG. 2a, the second reflecting sublayer 11 is located within the device region A, and the orthographic projection of the second reflecting sublayer 11 on the substrate 1 does not overlap with the peripheral region B. It should be noted that, because the peripheral region B refers to the region between the device region A and the boundary of the array base plate (the cutting line) in the fabrication of the array base plate, by providing the first reflecting sublayer 10 on the substrate 1 within the peripheral region B, and not providing the second reflecting sublayer 11, in an aspect, that can ameliorate the problem that, when the array base plate is cut from the mother board, the cutting process results in thin-film peeling of the reflecting layer 20. In another aspect, because the substrate 1 within the peripheral region B is provided with the first reflecting sublayer 10, and the first reflecting sublayer 10 covers the outer contour of the substrate 1, when the array base plate is emitting light, the first reflecting sublayer 10 within the peripheral region B can reflect the light rays emitted by the array base plate, which ameliorates the problem of a high difference in the optical brightnesses of the peripheral region B and the device region A of the array base plate, and increases to a large extent the light-emission amount of the array base plate in the direction perpendicular to the plane where the substrate 1 is located, thereby increasing the luminous efficiency of the array base plate.

In some embodiments, if both of the materials of the first reflecting sublayer 10 and the second reflecting sublayer 11 comprise a white ink and both of the ranges of the thicknesses of the first reflecting sublayer 10 and the second reflecting sublayer 11 are 25 -35 μm, in the array base plate shown in FIG. 2a, the difference between the numerical values of the reflectivities to light rays of the reflecting layer 20 within the device region A and the reflecting layer 20 within the peripheral region B is within 5%, which does not result in an obvious optical difference between the device region A and the peripheral region B.

In some embodiments of the present application, referring to FIG. 1a, both of the orthographic projections on the substrate 1 of the first reflecting sublayer 10 and the second reflecting sublayer 11 extend and cover the peripheral region B. Further, the boundaries of the first reflecting sublayer 10 and the second reflecting sublayer 11 and the outer contour of the substrate 1 substantially coincide. Therefore, when the array base plate is emitting light, the first reflecting sublayer 10 and the second reflecting sublayer 11 that are within the peripheral region B can reflect the light rays emitted by the array base plate, which, by the dual effect of the first reflecting sublayer 10 and the second reflecting sublayer 11, can ameliorate excellently the problem of a high difference in the optical brightnesses of the peripheral region B and the device region A of the array base plate, and increases to a large extent the light-emission amount of the array base plate in the direction perpendicular to the plane where the substrate 1 is located, thereby increasing the luminous efficiency of the array base plate.

In some embodiments, referring to FIG. 2*d*, the array base plate further comprises a bonding region D located on one side of it. The bonding region D is not provided with the reflecting layer 20. The bonding region D comprises a plurality of bonding-terminal groups 107. One end of each of the bonding-terminal groups 107 is used to be connected to a golden finger of an external circuit (a circuit board or an integrated circuit) to receive an electric signal, and the other end is connected to the electrically conductive pattern, for example, a signal line, on the array base plate to transmit the electric signal.

In some embodiments of the present application, the first reflecting sublayer 10 and the second reflecting sublayer 11 have equal thicknesses in the direction perpendicular to the substrate 1.

As an example, the thicknesses of the first reflecting sublayer 10 and the second reflecting sublayer 11 in the direction perpendicular to the substrate 1 are both 25 µm, or are both 30 µm, or are both 35 µm.

In some embodiments of the present application, referring to FIG. 1*a* or 2*a,* the array base plate further comprises an auxiliary reflecting part 13. The auxiliary reflecting part 13 is located on the inter-layer-medium layer 30, and the auxiliary reflecting part 13 is connected to the reflecting layer 20.

If the process stability is sufficiently high, within the device region A, the orthographic projection of the reflecting layer 20 on the substrate 1 covers the part of the inter-layer-medium layer 30 other than the hollow region L. However, taking into consideration the process precision and the fabrication error, in the practical fabricating process, within the part of the device region A other than the hollow region L, the orthographic projection of the reflecting layer 20 on the substrate 1 falls within the orthographic projection of the inter-layer-medium layer 30 on the substrate 1. Therefore, in order to ensure the effect of reflection, after the reflecting layer 20 has been provided, the auxiliary reflecting part 13 is subsequently provided to enhance the effect of reflection.

In some embodiments, if the reflecting layer 20 is fabricated by multiple times of screen printing, referring to FIG. 1*a,* the reflecting layer 20 at the edges of the hollow region L may be of a step shape, and the reflecting layer 20 adjacent to the edges of the hollow region L exposes the part of the inter-layer-medium layer 30 that is located within the hollow region L. In this case, the auxiliary reflecting part 13 may be subsequently provided on that part of the inter-layer-medium layer 30, to cover part of the surface of the inter-layer-medium layer 30 exposed by the reflecting layer 20 at the edges of the hollow region L, so as to further increase the light-emission amount of the array base plate in the direction perpendicular to the plane where the substrate 1 is located, thereby increasing the luminous efficiency of the array base plate.

In some embodiments, the provision of the auxiliary reflecting part 13 at the side wall of the hollow region L of the reflecting layer 20 can reduce the radial dimension of the hollow region L, and increase the size precision of the hollow region L. All of the figures are marked as the radial dimension of the hollow region L is not reduced.

In some embodiments, referring to FIG. 2*b*, the distance T2 between the surface of the auxiliary reflecting part 13 that contacts the inter-layer-medium layer 30 and the surface of the auxiliary reflecting part 13 that is further from the inter-layer-medium layer 30 is greater than the distance T1 between the surface of the reflecting layer 20 that contacts the inter-layer-medium layer 30 and the surface of the reflecting layer 20 that is further from the inter-layer-medium layer 30.

As an example, the range of the distance T2 between the surface of the auxiliary reflecting part 13 that contacts the inter-layer-medium layer 30 and the surface of the auxiliary reflecting part 13 that is further from the inter-layer-medium layer 30 may be 50 µm-80 µm, and the range of the distance T1 between the surface of the reflecting layer 20 that contacts the inter-layer-medium layer 30 and the surface of the reflecting layer 20 that is further from the inter-layer-medium layer 30 may be 30 µm-50 µm.

It should be noted that the auxiliary reflecting part 13 may be provided around the edge of the hollow region L by spray coating.

In some embodiments, the material of the auxiliary reflecting part 13 comprises a silicon-based white glue, and the color of the silicon-based white glue is the white color, whereby the color of the auxiliary reflecting part 13 is substantially the same as the color of the reflecting layer 20, to ensure that the reflectivity of the auxiliary reflecting part 13 to light rays is close to the reflectivity of the reflecting layer 20 to light rays.

In some embodiments of the present application, referring to FIG. 1a or FIG. 2a, the auxiliary reflecting part 13 comprises a first reflecting part 132 and a second reflecting part 131, and the first reflecting part 132 and the second reflecting part 131 are of an integral structure.

The hollow region L in the reflecting layer 20 exposes part of the area of the inter-layer-medium layer 30, an orthographic projection of the first reflecting part 132 on the substrate 1 is located within the hollow region L, and the first reflecting part 132 directly contacts the inter-layer-medium layer 30. The second reflecting part 131 directly contacts the surface of the reflecting layer 20 that is further from the substrate 1, and an orthographic projection of the second reflecting part 131 on the substrate 1 overlaps with an orthographic projection of the reflecting layer 20 on the substrate 1.

In some embodiments, referring to FIG. 2a, the second reflecting part 131 covers the surface of part of the first reflecting sublayer 10 that is further from the substrate 1, and the second reflecting part 131 and the second reflecting sublayer 11 have a gap Z therebetween in the direction parallel to the plane where the substrate 1 is located. Alternatively, referring to FIG. 2b, the second reflecting part 131 covers the surface of part of the first reflecting sublayer 10 that is further from the substrate 1, and the second reflecting part 131 is connected to the second reflecting sublayer 11 in the direction parallel to the plane where the substrate 1 is located. Alternatively, referring to FIG. 2c, the second reflecting part 131 covers the surface of part of the first reflecting sublayer 10 that is further from the substrate 1, and the second reflecting part 131 also covers the surface of part of the second reflecting sublayer 11 that is further from the substrate 1.

In some embodiments of the present application, referring to FIG. 1a or FIG. 2a, the array base plate further comprises a plurality of packaging units 14 corresponding to the devices 12, the orthographic projections of the packaging units 14 on the substrate 1 cover the orthographic projections of the devices 12 on the substrate 1, and the orthographic projections of the packaging units 14 on the substrate 1 partially overlap with an orthographic projection of the reflecting layer on the substrate 1.

As an example, as shown in FIG. 1a or FIG. 2a, each of the packaging units 14 wraps one of the devices 12. The packaging units 14 do not only serve to package and protect the devices 12, but also, by being configured to have a shape far from the surface of the substrate 1, for example, being configured to have a surface like a convex lens, can further adjust the light exiting angles of the light emitting devices included in the devices 12.

In some embodiments, the array base plate may further comprise a packaging layer provided on the side of the device 12 that is further from the substrate 1, to protect the device 12.

As an example, the packaging layer may cover the plurality of devices 12 as a whole layer.

FIG. 4 shows a schematic structural diagram of the device region A of the array base plate. Referring to FIG. 4, the device region A of the array base plate comprises a buffer layer 2 and a first electrically conductive layer 7 that are sequentially arranged on the substrate 1, and the inter-layer-medium layer 30 is located on the side of the first electrically conductive layer 7 that is further from the substrate 1. The inter-layer-medium layer 30 comprises a first insulating layer 8 and a first planarization layer 9, and the first planarization layer 9 is located at least between the first insulating layer 8 and the reflecting layer 20.

The first electrically conductive layer 7 is used to form the electrically conductive pattern.

As an example, referring to FIG. 4, the array base plate is provided with the first electrically conductive layer 7. The part of the first electrically conductive layer 7 that is covered by the first insulating layer 8 forms a trace 73 in the electrically conductive pattern, to be used to transmit an electric signal. Moreover, the part of the first electrically conductive layer 7 that is not covered by the first insulating layer 8 and further from the surface of the substrate 1 forms an electrically conductive bonding pad, to be used to be electrically connected to the device 12, to transmit the electric signal transmitted in the trace 73 to the device 12.

As an example, if the substrate 1 has a sufficient room for the arrangement of all of the electrically conductive patterns, the array base plate may comprise merely one electrically conductive layer.

In some embodiments, the material of the first electrically conductive layer 7 may comprise any one of copper, aluminum, nickel, molybdenum and titanium, or a combination of several of the metals that are arranged in stack.

As an example, the first electrically conductive layer 7 may comprise a molybdenum-nickel-titanium alloy (MoNiTi) layer, a copper metal layer and a molybdenum-niobium alloy (MoNb) layer that are arranged sequentially in stack. The molybdenum-nickel-titanium alloy layer can increase the nucleation density of the copper metal crystal grains in electroplating. The molybdenum-niobium alloy layer serves to prevent the metal copper from being oxidized. The range of the thickness of the molybdenum-nickel-titanium alloy layer in the first electrically conductive layer 7 may be 290 Å-310 Å. For example, the thickness may be 290 Å, 296 Å, 300 Å, 305 Å or 310 Å.

In some embodiments, the range of the thickness of the first electrically conductive layer 7 may be 1.5 μm-7 μm. For example, the thickness may be 1.5 μm, 2 μm, 4 μm, 6.5 μm or 7 μm.

Figures 5, 6:
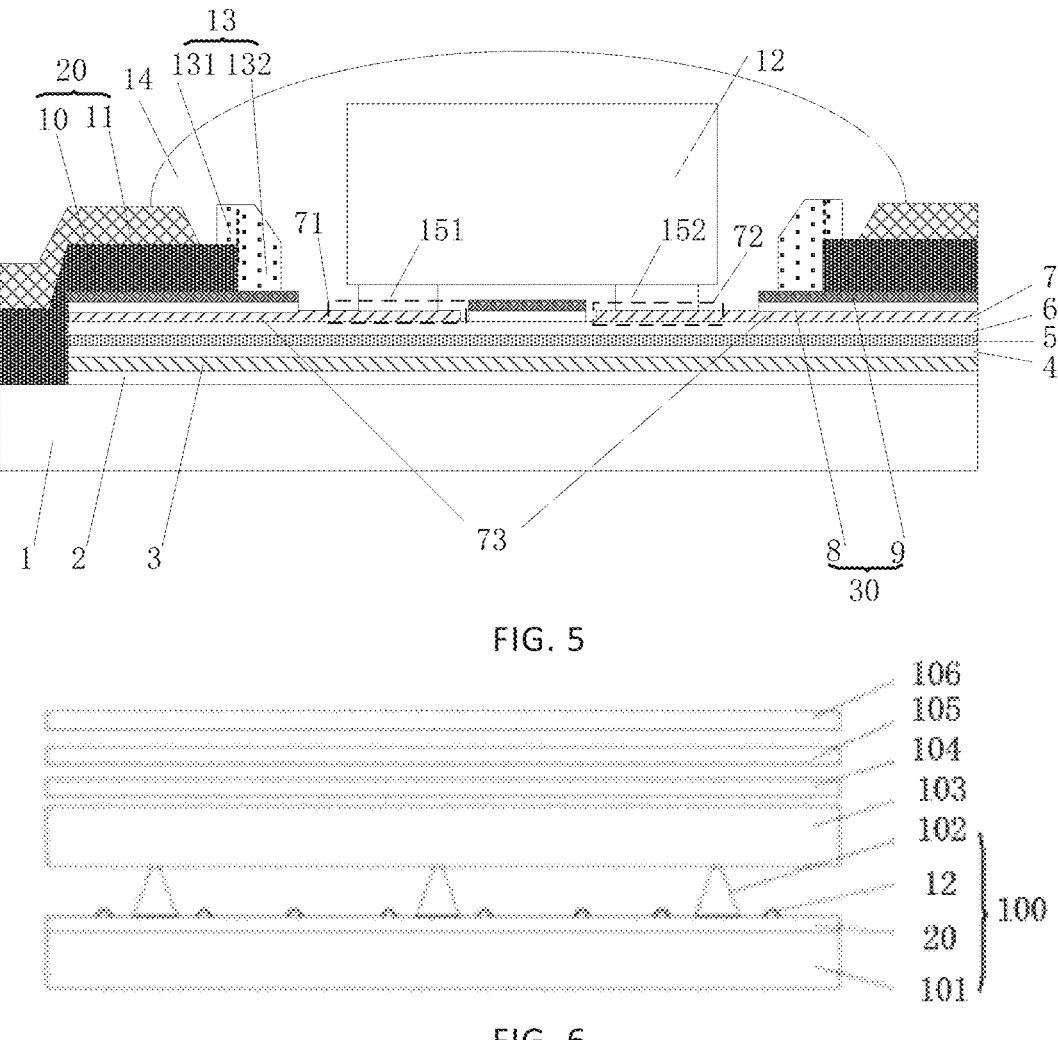
FIG. 6 is a schematic structural diagram of a light emitting apparatus according to an embodiment of the present application.

FIG. 5 shows another schematic structural diagram of the device region A of the array base plate. Referring to FIG. 5, the device region A of the array base plate further comprises a second electrically conductive layer 3, a second insulating layer 4, a second planarization layer 5 and a third insulating layer 6 that are arranged sequentially in stack on the buffer layer 2, and the third insulating layer 6 is located on the side of the first electrically conductive layer 7 that is further from the first insulating layer 8.

In some embodiments, referring to FIG. 5, the first electrically conductive layer 7 and the second electrically conductive layer 3 together form the electrically conductive pattern. The first electrically conductive layer 7, as compared with the second electrically conductive layer 3, is further from the substrate 1. Therefore, the part of the surface of the first electrically conductive layer 7 that is further from the substrate 1 that is not covered by the inter-layer-medium layer 30 forms an electrically conductive bonding pad, to be used to be electrically connected to the device 12, and the part of the first electrically conductive layer 7 that is covered by the other film layers and the second electrically conductive layer 3 form the signal line and the connecting line in the electrically conductive pattern, to be used to receive and transmit to the device 12 an electric signal from the external signal-source circuit. The figures according to the embodiments of the present application do not particularly illustrate the electrically conductive pattern of the second electrically conductive layer 3, and its patterned structure may be decided according to the circuit layout design of the array base plate.

In some embodiments, the material of the second electrically conductive layer 3 may comprise any one of copper, aluminum, nickel, molybdenum and titanium, or a combination of several of the metals that are arranged in stack.

In some embodiments, the second electrically conductive layer 3 may comprise a molybdenum-niobium alloy layer, a copper metal layer and a protecting layer that are arranged sequentially in stack. The protecting layer may comprise any one of a copper-nickel alloy (CuNi), nickel and indium tin oxide (referred to for short as ITO). The molybdenum-niobium alloy layer serves to increase the adhesive force between the metal copper and the film layer closest to the substrate. The protecting layer serves to prevent the metal copper from being oxidized.

As an example, the range of the thickness of the second electrically conductive layer 3 may be 0.5-10 μm. For example, the thickness may be 0.5 μm, 1.8 μm, 1.8 μm, 2.7 μm or 10 μm.

In some embodiments of the present application, referring to FIG. 1a or 2a, the part of the surface of the first electrically conductive layer 7 that is further from the substrate 1 that is exposed forms an electrically conductive bonding pad, the electrically conductive bonding pad comprises, for example, at least one first bonding pad 71 and at least one second bonding pad 72, the inter-layer-medium layer 30 has at least one first opening K1 and at least one second opening K2 in the direction perpendicular to the substrate 1, the first opening K1 exposes the region where the first bonding pad 71 is located, and the second opening K2 exposes the region where the second bonding pad 72 is located.

The first bonding pad 71 is electrically connected to a first weld leg 151 of the device 12 by the first opening K1, and the second bonding pad 72 is electrically connected to a second weld leg 152 of the device 12 by the second opening K2.

In some embodiments, the first bonding pad 71 and the first weld leg 151 are electrically connected by a soldering material (for example, a tin solder, not shown in the figures) located in the first opening K1, and the second bonding pad 72 and the second weld leg 152 are electrically connected by a soldering material located in the second opening K2, so as to transmit an electric signal to the device 12 via the first bonding pad 71 and the second bonding pad 72.

In some embodiments, the soldering material may be printed on the first bonding pad 71 and the second bonding pad 72 in advance, and may also be prefabricated on the first weld leg 151 and the second weld leg 152.

In some embodiments of the present application, the array base plate further comprises a plurality of supporting columns 102, the supporting columns 102 are located on the side of the reflecting layer 20 that is further from the substrate 1, and the orthographic projections of the supporting columns 102 on the substrate 1 and the orthographic projections of the devices 12 on the substrate 1 do not overlap.

It should be noted that the color of the supporting columns 102 may be selected according to demands. For example, the color of the supporting columns 102 may be the white color, so that the reflectivity of the supporting columns 102 is close to the reflectivity of the reflecting layer 20. As another example, the supporting columns 102 may be transparent.

Figure 1B:
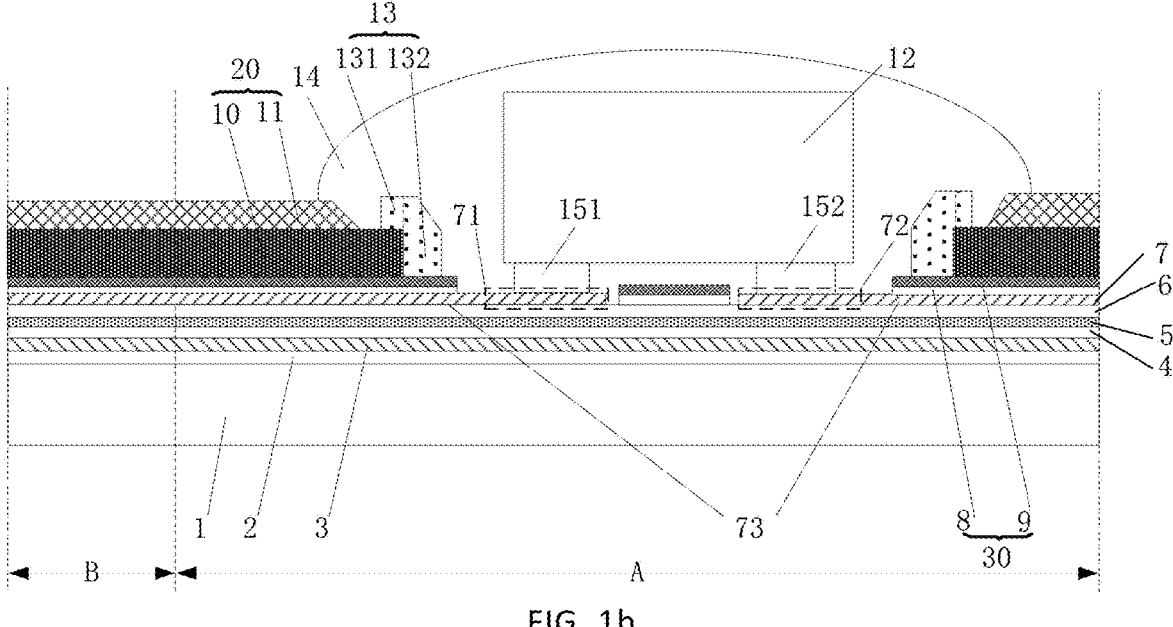

In some embodiments, referring to FIG. 1B, the peripheral region B may further comprise one or more film layers of the buffer layer 2, the second electrically conductive layer 3, the second insulating layer 4, the second planarization layer 5, the third insulating layer 6, the first electrically conductive layer 7, the first insulating layer 8 and the first planarization layer 9. The other film layers comprised by the peripheral region B than the reflecting layer 20 may be decided according to the practical configuration, and are not limited herein.

An embodiment of the present application further provides a light emitting apparatus. Referring to FIG. 6, the light emitting apparatus comprises the array base plate 100 stated above.

The substrate 1 and all of the film layers between the substrate 1 and the reflecting layer 20 in FIG. 1a form the base 101 shown in FIG. 6. As an example, the base 101 comprises the substrate 1, and the buffer layer 2, the second electrically conductive layer 3, the second insulating layer 4, the second planarization layer 5, the third insulating layer 6, the first electrically conductive layer 7, the first insulating layer 8 and the first planarization layer 9 that are arranged in stack on the substrate 1.

The film layers and components particularly comprised by the array base plate 100 may refer to the above description, and are not discussed further herein.

In some embodiments, there is provided a light emitting apparatus, wherein the light emitting apparatus comprises the array base plate according to the embodiments of the present application.

In some embodiments, the light emitting apparatus may further comprise a protecting base plate (or cover plate) covering the array base plate.

The light emitting apparatus may be used as a backlight device, and may also be used as a displaying device. Particularly, if all of the plurality of devices 12 in the light emitting apparatus are light emitting devices that emit lights of a single color, then the light emitting apparatus may be used as a backlight device. If the plurality of devices 12 in the light emitting apparatus comprise light emitting devices that emit lights of different colors, for example, three types of the light emitting devices emitting a red light, emitting a green light and emitting a blue light, then the light emitting apparatus may be used as a displaying device.

In some embodiments, when the array base plate 100 is used in a displaying device, the array base plate 100 may not be provided with the supporting columns 102.

In some embodiments of the present application, referring to FIG. 6, the light emitting apparatus further comprises a diffuser plate 103, a quantum-dot film 104, a diffuser sheet 105 and a composite film 106 that are arranged sequentially in stack. The diffuser plate 103 is located on the light exiting side of the array base plate 100.

The plurality of supporting columns 102 are used to support the plurality of optical films (including the diffuser plate 103, the quantum-dot film 104, the diffuser sheet 105 and the composite film 106), so that the reflecting layer 20 in the array base plate 100 and the optical films have a light blending distance therebetween, which can ameliorate the lamp shadow generated by the array base plate, and improve the displayed image quality of the light emitting apparatus.

In some embodiments, the material of the diffuser plate 103 may comprise any one of glass, polystyrene (PS), polycarbonate (PC), polyethylene (PE), polypropylene (PP), polyvinyl chloride (PVC), polyethylene terephthalate (PET), polymethyl methacrylate (PMMA) and acrylic acid (MMA).

Particularly, the quantum-dot film (QD Enhancement Film, referred to for short as QDEF) is a technique in which a quantum-dot phosphor powder and a polymer are mixed uniformly to be fabricated into a film. As an example, the material of the quantum-dot film 104 may comprise a perovskite-quantum-dot material, and its thickness is generally approximately 100 μm.

In some embodiments, the material of the diffuser sheet 105 may be the same as the material of the diffuser plate 103.

In some embodiments, the composite film 106 is not only used to increase the optical efficiency, but also is used as the protecting film of the diffuser plate 103, the quantum-dot film 104 and the diffuser sheet 105, to protect them, to prevent them from being scratched or damaged.

In the light emitting apparatus according to the embodiments of the present application, because the outer contour of the substrate 1 and the outer contour of the peripheral region B of the array base plate are the same, and the reflecting layer 20 located within the peripheral region B covers the substrate 1 located within the peripheral region B, the reflecting layer 20 located within the peripheral region B covers the outer contour of the substrate 1, so that the substrate 1 within the peripheral region B has no no-light-reflection region. Therefore, when the light emitting apparatus is emitting light, the reflecting layer 20 within the peripheral region B can reflect the light rays emitted by the light emitting apparatus, which ameliorates to a large extent the problem of a high difference in the optical brightnesses of the peripheral region B and the device region A of the light emitting apparatus, and increases to a large extent the light-emission amount of the light emitting apparatus in the direction perpendicular to the plane where the substrate 1 is located, thereby increasing the luminous efficiency of the light emitting apparatus.

Figure 7:
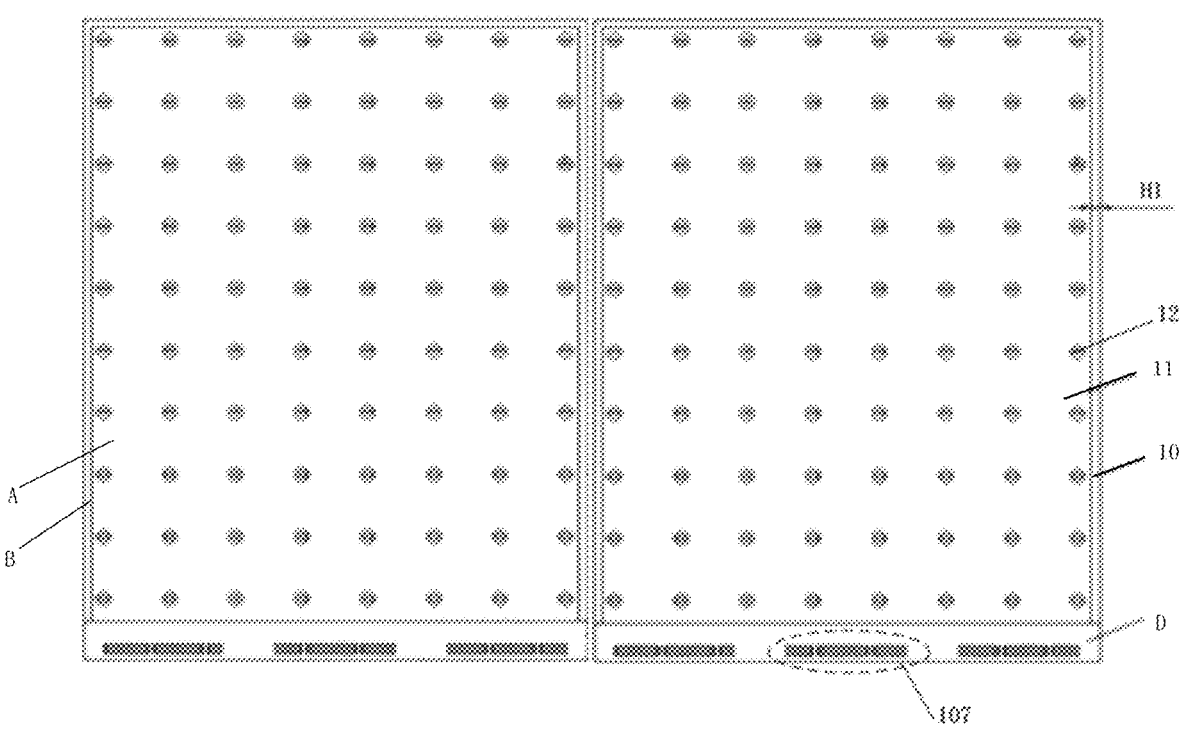
FIG. 7 is a schematic structural diagram of a spliced displaying apparatus according to an embodiment of the present application.

An embodiment of the present application further provides a spliced displaying apparatus. Referring to FIG. 7, the spliced displaying apparatus comprises at least two light emitting pparatuses stated above.

It should be noted that, in the light emitting apparatuses used for the spliced displaying apparatus, the plurality of devices 12 include all of three types of light emitting devices emitting a red light, emitting a green light and emitting a blue light.

In some embodiments, the spliced displaying apparatus may further comprise a multiport transponder, an electric-power supplying device, a first frame body and a second frame body.

All of the light-exiting surfaces of the light emitting apparatuses are located in the same one plane, and all of the light emitting apparatuses are fixed to the first frame body. The first frame body is fixed to the second frame body, and the second frame body is located on the side of the first frame body that is further from the light emitting appara- tuses. Both of the multiport transponder and the electric-power supplying device are fixed to the second frame body. The multiport transponder is electrically connected to the electric-power supplying device, and all of the bonding-terminal groups 107 of the light emitting apparatuses are electrically connected to the multiport transponder.

It should be noted that the spliced displaying apparatus shown in FIG. 7 is obtained by splicing the light emitting apparatuses formed by the array base plate shown in FIG. 2*d*.

In the spliced displaying apparatus according to the embodiments of the present application, the peripheral region B of the light emitting apparatuses used for the spliced displaying apparatus is also provided with the reflecting layer 20 (in FIG. 7, the peripheral region B is provided with the first reflecting sublayer 10), which can reflect the light rays emitted by the light emitting appara- tuses, thereby ameliorating to a large extent the problem of a high difference in the optical brightnesses of the peripheral region B and the device region A of the light emitting apparatuses. In the spliced displaying apparatus formed by splicing the light emitting apparatuses, as the seam has a sufficiently low width and is difficult to be perceived by human eyes, the region between the two neighboring light emitting apparatuses have no optical dark space, thereby highly improving the effect of displaying of the spliced displaying apparatus.

Figure 8A:
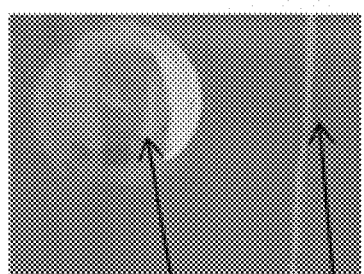
FIG. 8a is a microscopic interference pattern of a scratch of the packaging unit and a knife mark of the reflecting layer of an array base plate in the related art.
Figure 8B:
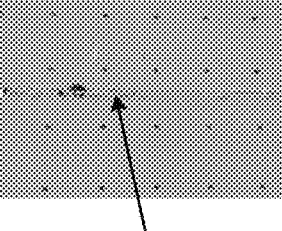
FIG. 8b is a microscopic diagram of a knife mark of the reflecting layer of an array base plate in the related art.
Figure 8C:
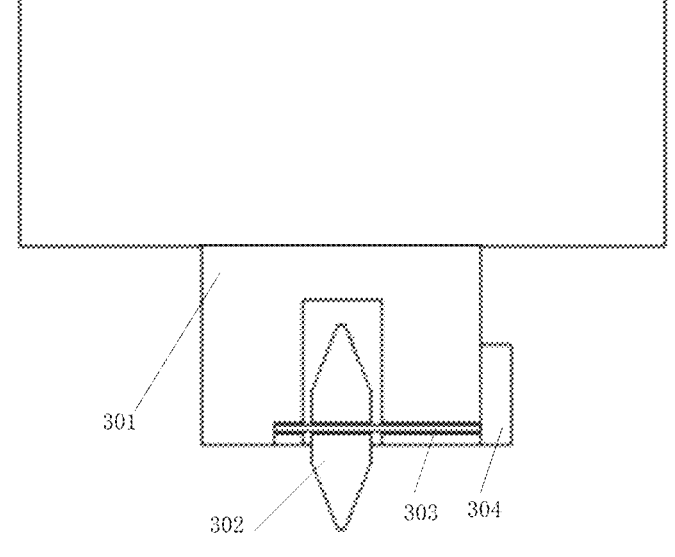
FIG. 8c is a schematic structural diagram of a cutting knife flywheel according to an embodiment of the present application.

Regarding the array base plate stated above, because the substrate 1 within the peripheral region B is provided with the reflecting layer 20, in an aspect, when the mother board of the array base plate is cut at the front by using a conventional knife-flywheel front cutting process to obtain the array base plate, referring to FIG. 8*c*, because the cutting knife flywheel 302 is fixed to a knife-flywheel clamp 301, the knife-flywheel clamp 301 might scratch the packaging unit 14 on the array base plate, and leave a scratch shown in FIG. 8*a* on the packaging unit 14. In another aspect, because the cutting knife flywheel 302 directly cuts the reflecting layer 20, it leaves a knife mark shown in FIGS. 8*a* and 8*b* on the reflecting layer 20, which causes the local reflecting layer 20 to peel, and the chip of the peeled reflecting layer 20 falls back onto the reflecting layer 20, which affects the effect of reflection of the reflecting layer 20. In yet another aspect, when the knife-flywheel front cutting process is used, the reflecting layer 20 is cut, and, as influenced by the reflecting layer 20, the cutting knife flywheel 302 has difficulty in directly cutting the surface of the substrate 1, which results in failure of the cutting.

Figure 8D:
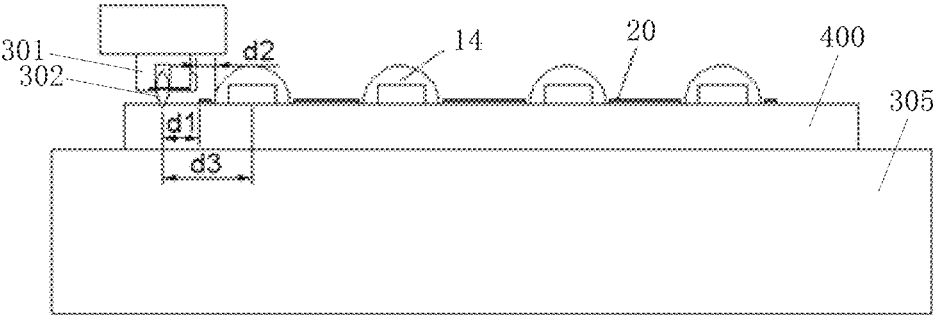
FIG. 8d is a schematic diagram of a knife-flywheel front cutting process according to an embodiment of the present application.

FIG. 8*d* shows a schematic diagram of the knife-flywheel front cutting process. The to-be-cut base plate is located on a cutting platform 305. When the knife-flywheel front cut- ting process is used, merely if the following conditions are satisfied, it can be ensured that the cutting succeeds. Firstly, merely if the distance d1 between the reflecting layer 20 and the axis of the cutting knife flywheel 302 (the position where the cutting line is located) is greater than or equal to 0.7 mm, the knife flywheel 302 can directly cut the surface of the substrate 1. Secondly, merely if the distance d2 between the knife-flywheel clamp 301 and the packaging unit 104 is greater than 0 mm, it can be ensured that the knife-flywheel clamp 301 does not scratch the packaging unit 104. In the knife flywheels used in practical applications, the distance between its axis and the edge of one side of the clamp 301 is approximately 3 mm, and if the radius r of the packaging unit 14 is 1.25 mm, and the fluctuation range of the cutting process is 0.25 mm, the distance d3 between the axis of the cutting knife flywheel 302 and the geometric center of the orthographic projection of the packaging unit 14 on the mother-board substrate 400 satisfies d3≥3 mm+1.25 mm+0.25=4.5 mm. However, in the array base plate obtained by using the knife-flywheel front cutting process, because the reflecting layer 20 does not extend to the peripheral region B, the peripheral region B has the problem of a high difference in the optical brightnesses with the device region A.

Figure 9:
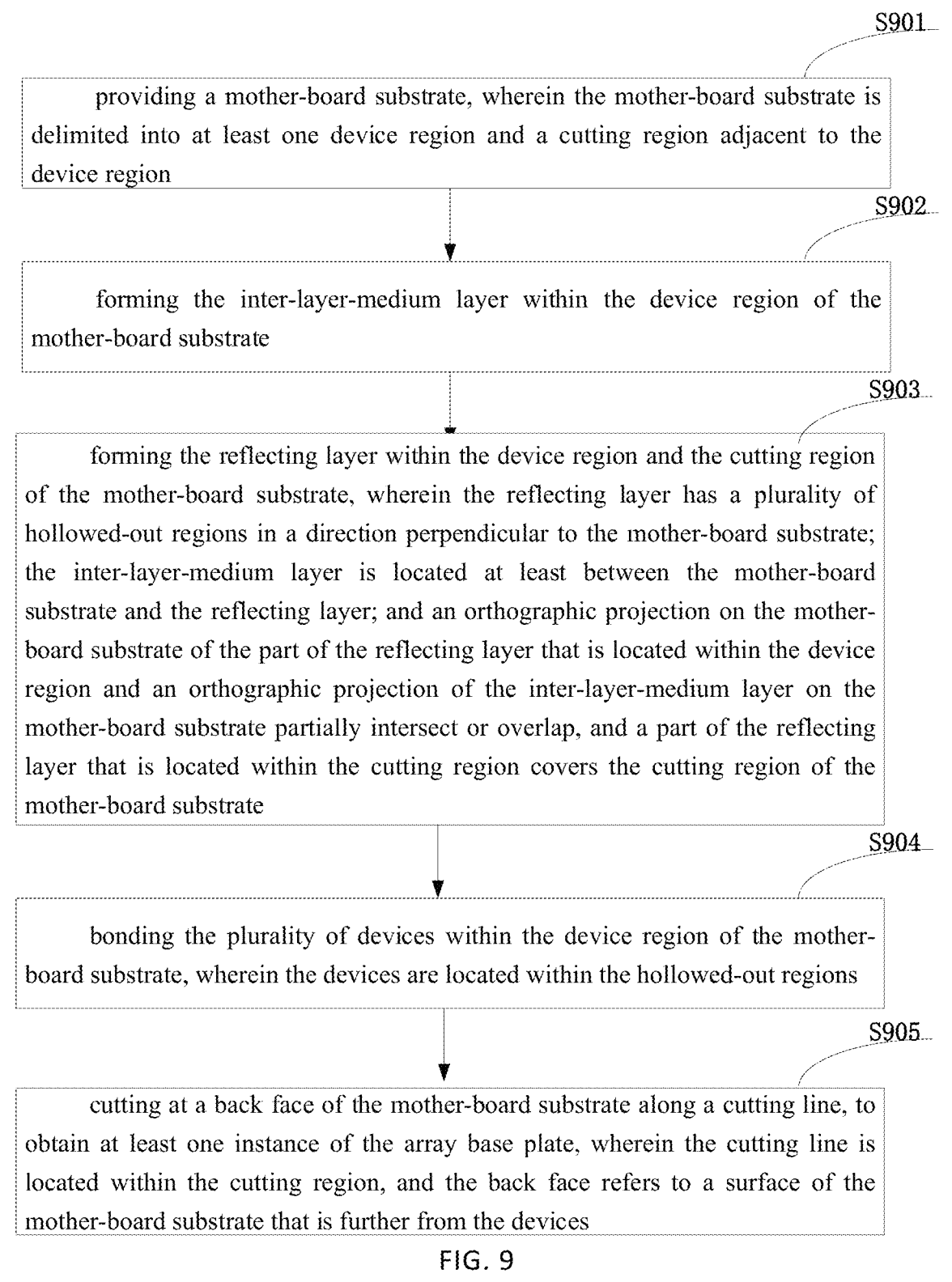
Figures 10, 11, 12A:
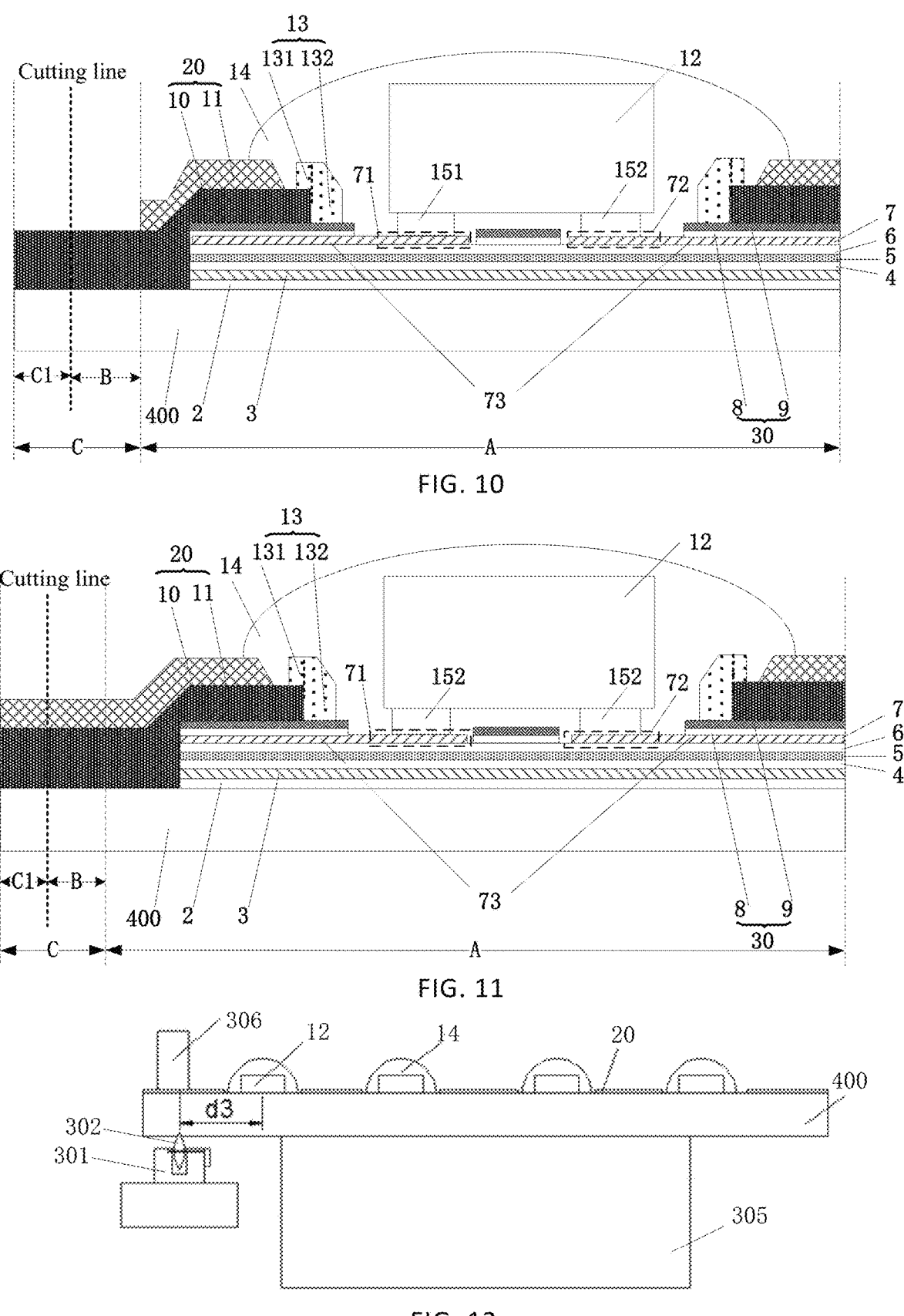
FIG. 10 is a schematic structural diagram of a mother board of an array base plate according to an embodiment of the present application.
FIG. 11 is a schematic structural diagram of a mother board of another array base plate according to an embodiment of the present application.
FIGS. 12a, 13a and 14 are schematic diagrams of three types of the back side cutting processes according to the embodiments of the present application.

Accordingly, an embodiment of the present application provides a method for fabricating an array base plate, wherein the method is applied to fabricating the array base plate stated above. Referring to FIG. 9, the method com- prises:

S901: providing a mother-board substrate 400 shown in FIG. 10 or 11, wherein the mother-board substrate 400 is delimited into at least one device region A and a cutting region C adjacent to the device region A.

It should be noted that, after the region C1 outside the cutting line within the cutting region C has been removed, the peripheral region B can be obtained.

As an example, after the mother-board substrate 400 shown in FIG. 10 has been cut along the cutting line and the region C1 of the mother-board substrate 400 has been removed, at least one substrate 1 can be obtained.

S902: forming the inter-layer-medium layer 30 within the device region A of the mother-board substrate 400.

S903: forming the reflecting layer 20 within the device region A and the cutting region C of the mother-board substrate 400.

The reflecting layer 20 has a plurality of hollow regions L in the direction perpendicular to the mother-board sub- strate 400. The inter-layer-medium layer 30 is located at least between the mother-board substrate 400 and the reflecting layer 20. An orthographic projection on the mother-board substrate 400 of the part of the reflecting layer 20 that is located within the device region A and an ortho- graphic projection of the inter-layer-medium layer 30 on the mother-board substrate 400 partially overlap, and a part of the reflecting layer 20 that is located within the cutting region C covers the cutting region C of the mother-board substrate 400.

S904: bonding the plurality of devices 12 within the device region A of the mother-board substrate 400, wherein the devices 12 are located within the hollow regions L.

Multiple types of devices 12 arranged in an array are provided within the device region A. The devices 12 include a light emitting device, and further include any one of sensing devices, minisized driving chips and other types of devices.

That the inter-layer-medium layer 30 is located at least between the substrate 1 and the reflecting layer 20 means that, referring to FIG. 1*a*, within the region of the array base plate where no device 12 is provided, the inter-layer-me- dium layer 30 is located between the substrate 1 and the reflecting layer 20, and within the hollow region L, part of the region between the electrically conductive patterns (be- tween the electrically conductive bonding pads 71, 72) is provided with part of the inter-layer-medium layer 30, and that part of the inter-layer-medium layer 30 is located between the substrate 1 and the device 12.

Referring to FIG. 10 and FIG. 1a, the inter-layer-medium layer 30 has at least one first opening K1 and at least one second opening K2 in the direction perpendicular to the mother-board substrate 400. The orthographic projections on the substrate 1 of the first opening K1 and/or the second opening K2 are located within the area of the orthographic projection of the hollow region L on the substrate 1.

The first openings K1 in the inter-layer-medium layer 30 expose the electrically conductive pattern 71 provided on the substrate 1, and the second openings K2 in the inter-layer-medium layer 30 expose the electrically conductive pattern 72 provided on the substrate 1, whereby the device 12 is connected to the electrically conductive pattern 71 and the electrically conductive pattern 72, and the electrically conductive pattern is connected to the external signal-source circuit so as to receive an electric signal.

Both of the device region A and the cutting region C are provided with the reflecting layer 20. As an example, referring to FIG. 10 or 11, all of the areas of the mother board of the array base plate other than the hollow region L for the provision of the devices 12 are provided with one reflecting layer 20.

In some embodiments, at least one of the film layers of the buffer layer 2, the second electrically conductive layer 3, the second insulating layer 4, the second planarization layer 5, the third insulating layer 6, the first electrically conductive layer 7, the first insulating layer 8 and the first planarization layer 9 may extend to the cutting region C, which may be decided according to the practical configuration, and is not limited herein.

S905: cutting at the back side of the mother-board substrate 400 along a cutting line, to obtain at least one array base plate, wherein the cutting line is located within the cutting region C, and the back side refers to the surface of the mother-board substrate 400 that is further from the devices 12.

FIG. 12a shows a schematic diagram of a back side cutting process.

In some embodiments, referring to FIG. 12a, when the mother-board substrate 400 is cut at the back side along the cutting line, the mother board of the array base plate is located on the cutting platform 305, and the cutting knife flywheel 302 is disposed at the back side of the mother-board substrate 400. In addition, because the cutting region of the mother-board substrate 400 is not supported by the cutting platform 305, and is in a hanging state, a roller 306 is provided on the other side of the mother board of the array base plate opposite to the cutting knife flywheel 302, so as to offset the cutting pressure generated when the cutting knife flywheel 302 is cutting at the back side of the mother-board substrate 400.

Because the back side of the mother-board substrate 400 is not provided with the reflecting layer 20, the cutting can be performed at any position of the cutting region according to the demand of the cutting. Accordingly, in the cutting, it is not required to consider the distance between the axis of the cutting knife flywheel 302 and the edge of the reflecting layer 20, and it is not required to consider the problem of scratching and wearing to the packaging units 14 that might be caused by the clamp 301 of the cutting knife flywheel 302. Furthermore, when the cutting is from the back side, the cutting knife flywheel 302 can directly contact the back side of the mother-board substrate 400, which does not have the problem of cutting failure caused by the influence by the reflecting layer 20.

Figure 13A:
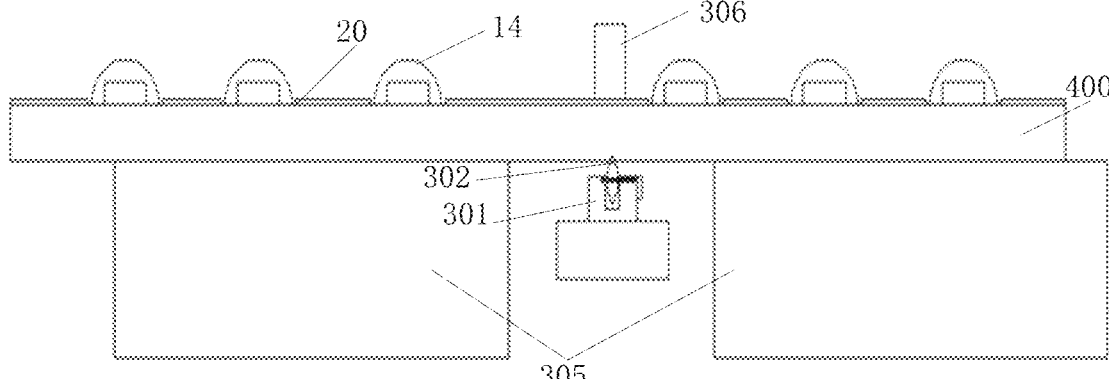

It should be noted that, in FIGS. 12a, 13a and 14a, the reflecting layer 20, the devices 12 and the packaging units 14 are shown on the mother-board substrate 400, the other components comprised by the mother board of the array base plate are not shown, and the other components comprised by the mother board of the array base plate are similar to the components comprised by the array base plate, which may particularly refer to the above description on the structure of the array base plate, and is not discussed further herein.

Figure 12B:
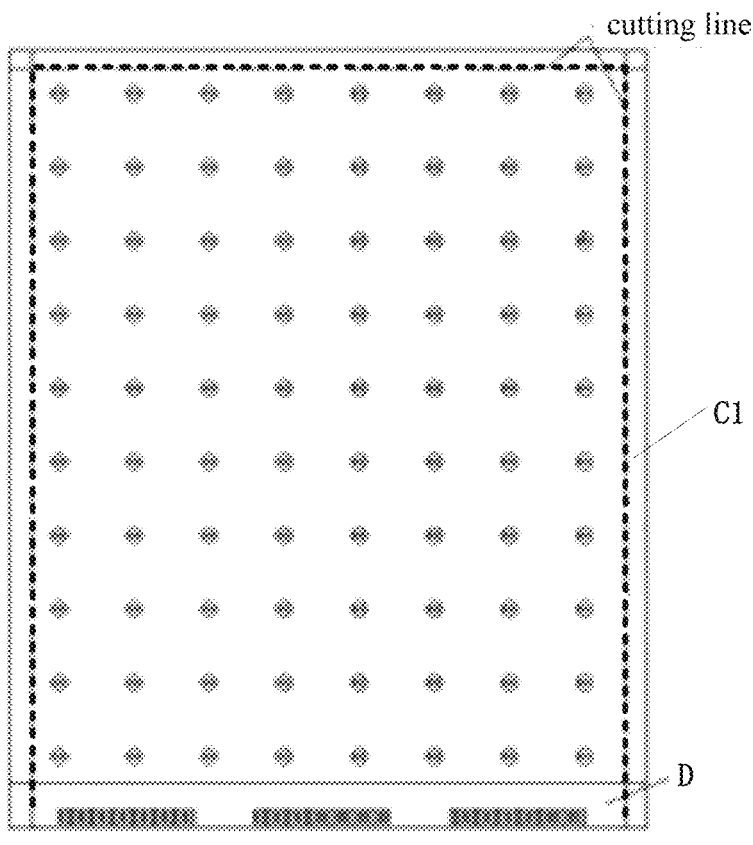

FIG. 12b shows a schematic diagram of the position of the cutting line of the mother board of the array base plate in FIG. 12a. In FIG. 12b, the position marked by the dotted line is the position where the cutting line is located, and after the region C1 outside the cutting line has been removed along the cutting line, the array base plate can be obtained. The region C1 of the mother board of the array base plate that is outside the cutting line is also provided with the reflecting layer 20, but, because the back side cutting process is employed, the reflecting layer 20 does not affect the cutting process.

Figure 13B:
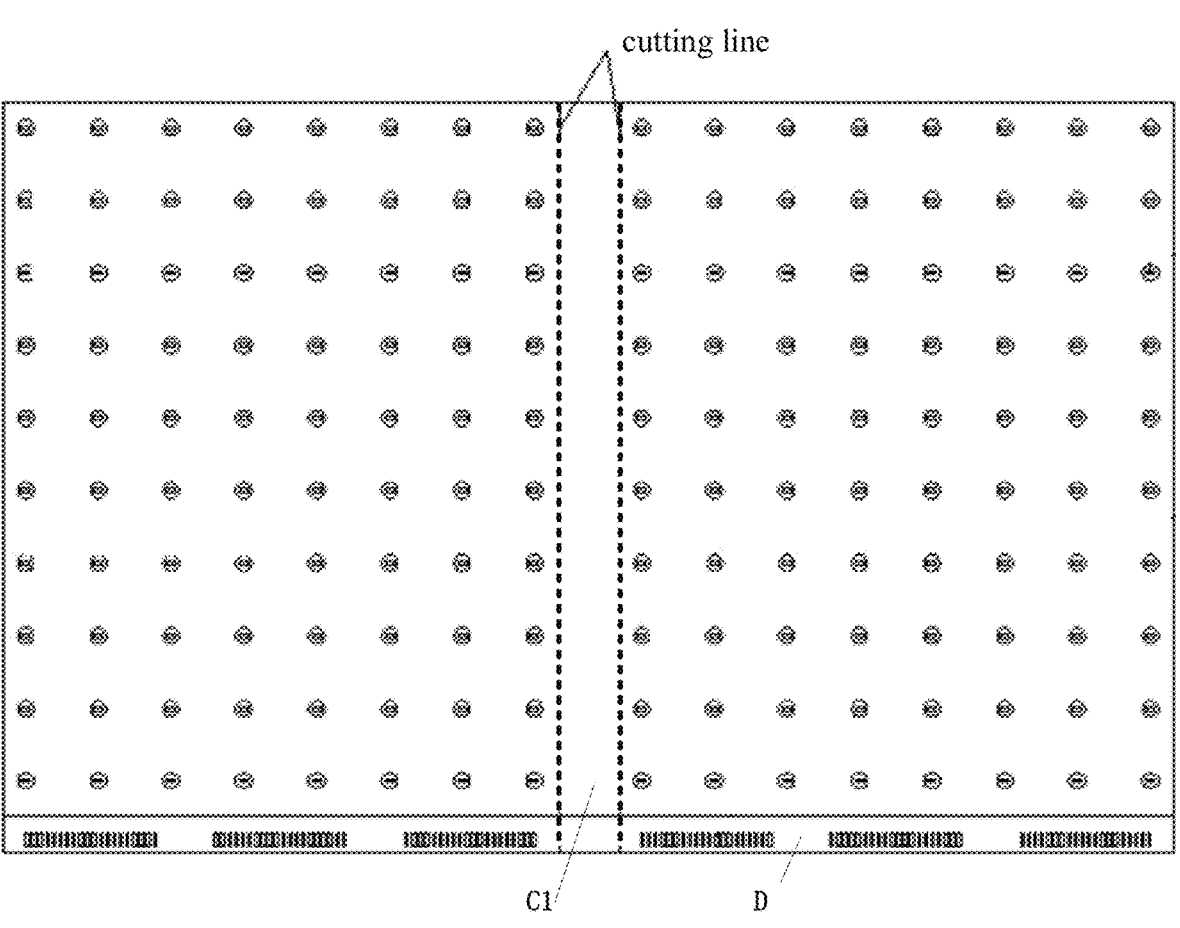

In some embodiments, as shown in FIG. 13a, FIG. 13a shows a schematic diagram of another back side cutting process. In FIG. 13a, the cutting line is located at the middle position of the mother board of two array base plates, and the middle position of the cutting platform 305 is excavated, so as to leave the room for providing the cutting knife flywheel 302 therein. FIG. 13b shows a schematic diagram of the position of the cutting line of the mother board of the array base plates in FIG. 13a. The region between the two cutting lines is the region C1 that is required to be cut off.

Figure 14:
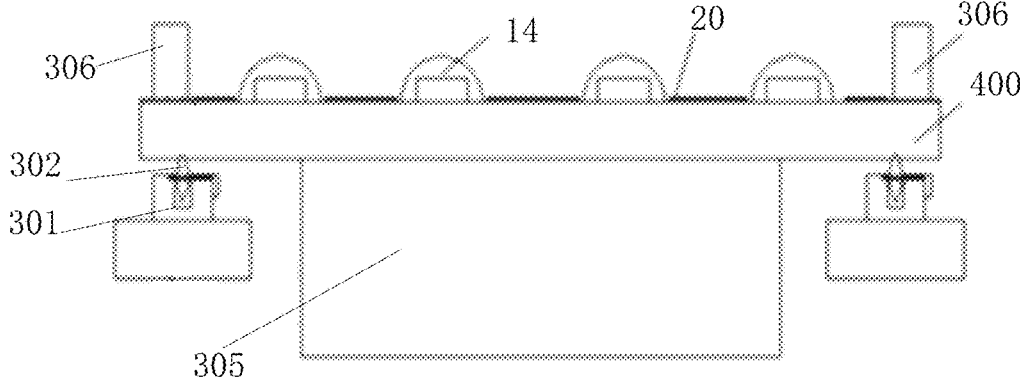

In some embodiments, as shown in FIG. 14, in order to increase the cutting efficiency when the cutting knife flywheel 302 cuts at the back side, a plurality of knife flywheels may be used to cut simultaneously. In FIG. 14, in the mother board of the array base plates corresponding to each of the positions where a cutting knife flywheel 302 is disposed, a roller 306 is disposed on the side of the reflecting layer 20 that is further from the mother-board substrate 400, so as to balance the cutting pressures generated when the cutting knife flywheels 302 are cutting.

Figure 18:
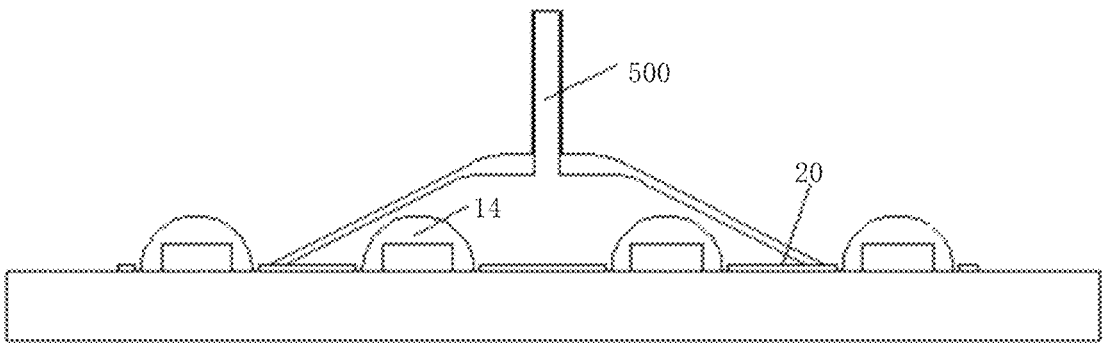
FIG. 18 is a schematic structural diagram of a vacuum suction cup according to an embodiment of the present application.

An embodiment of the present application provides a vacuum suction cup 500 shown in FIG. 18. The vacuum suction cup 500 is a soft-mouth suction cup, has an excellent sucking effect to array base plates of an uneven surface, and is used to, in the cutting, transport and move the mother board of the array base plate or the array base plate.

Figure 15A:
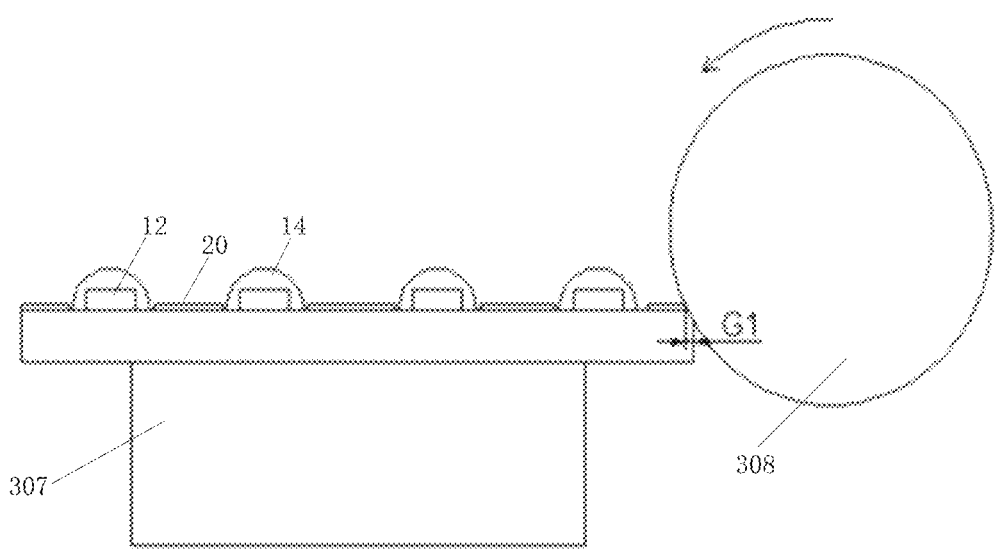
FIG. 15a is a schematic diagram of a grinding process of an array base plate in the related art.

Referring to FIG. 15a, after the cutting, the edge of the array base plate may be ground, so as to reduce the probability with which the edge of the array base plate is damaged due to protrusions, notches or microcracks that might exist, thereby increasing the reliability of the array base plate.

Figure 15B:
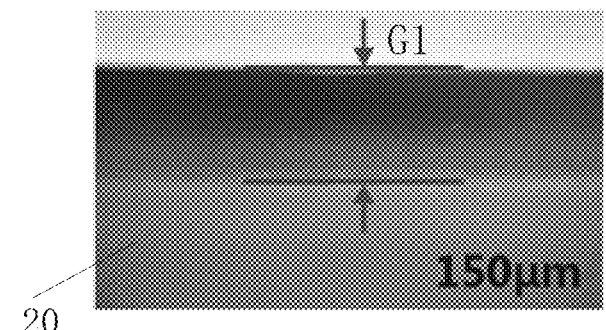
Figure 15C:
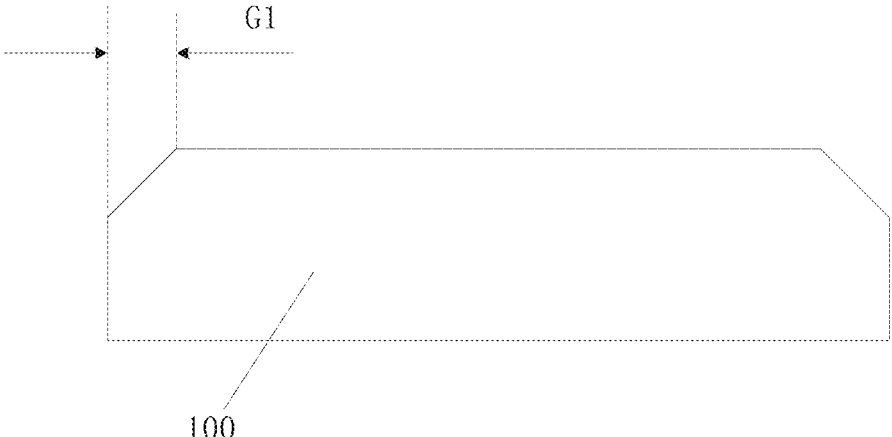

In an oblique-corner grinding process, the array base plate is placed on a grinding platform 307, and a grinding knife flywheel 308 rotates in the anticlockwise direction, whereby the grinding knife flywheel 308 firstly grinds the reflecting layer 20, and subsequently grinds the substrate 1, to prevent local peeling of the reflecting layer 20 caused by the pulling to the reflecting layer 20 if the substrate 1 is ground firstly. In the oblique-corner grinding process, in the grinding, the initial grinding point between the grinding knife flywheel 308 and the array base plate is the boundary between the surface of the reflecting layer 20 and the side of the substrate 1 shown in FIG. 15*a*, and after the grinding has ended, the array base plate generates ground regions shown in FIG. 15*c* (the regions where the oblique corners are located). By a microscopic test on those regions, it can been seen that the width of the ground region G1 is approximately 150 μm, as shown in FIG. 15*b*, and no reflecting layer 20 is within that region, which seriously affects the optical property of the array base plate.

Accordingly, in some embodiments of the present application, after the step of cutting at the back side of the mother-board substrate 400 along the cutting line, to obtain at least one array base plate, the fabricating method further comprises:

S906: grinding the edge of the array base plate by using a perpendicular grinding technique.

Figure 16:
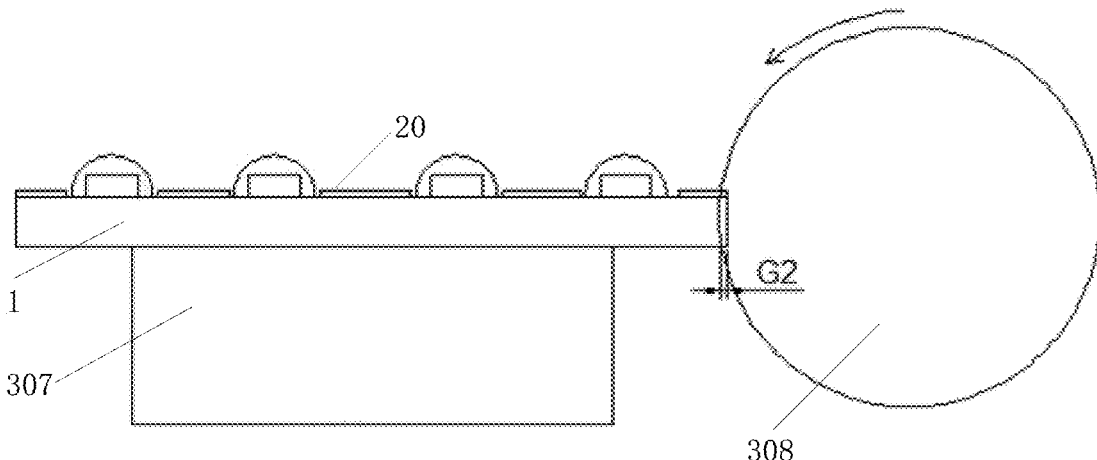
FIG. 16 is a schematic diagram of a grinding process of an array base plate according to an embodiment of the present application.

In some embodiments of the present application, the step S906 of grinding the edge of the array base plate by using the perpendicular grinding technique comprises:

S9061: referring to FIG. 16, in the direction perpendicular to the array base plate 100, grinding the side of the substrate 1 and the side of the reflecting layer 20 of the array base plate simultaneously, wherein the side of the substrate 1 and the side of the reflecting layer 20 are coplanar.

It should be noted that, in FIG. 16, the other film layers between the substrate 1 and the reflecting layer 20 are not shown, and may particularly refer to the above description.

In some embodiments, the process of grinding the array base plate by using the perpendicular grinding technique may refer to FIG. 16. The initial grinding point of the grinding knife flywheel 308 is at the side of the array base plate. Particularly, the grinding knife flywheel 308 rotates in the anticlockwise direction, and simultaneously grinds the side of the substrate 1 and the side of the reflecting layer 20, which can reduce to a large extent the difference between the wearing degree of the reflecting layer 20 and the wearing degree of the substrate 1 at the edge of the array base plate, thereby reducing the grinding width of the ground region G2. The grinding width of the ground region G2 of the array base plate that is ground by using the perpendicular grinding technique is approximately. The perpendicular grinding technique improves the optical property of the edge position of the array base plate to a large extent.

In some embodiments of the present application, the step S903 of forming the reflecting layer 20 within the device region A and the cutting region C of the mother-board substrate 400 comprises:

S9031: forming a first reflecting sublayer 10, wherein an orthographic projection of the first reflecting sublayer 10 on the mother-board substrate 400 is located within the device region A and the cutting region C; and S9032: forming a second reflecting sublayer 11, wherein an orthographic projection of the second reflecting sublayer 11 on the mother-board substrate 400 is located within the device region A;

or forming a first reflecting sublayer 10, wherein an orthographic projection of the first reflecting sublayer 10 on the mother-board substrate 400 is located within the device region A and the cutting region C; and forming a second reflecting sublayer 11 within the device region A and the cutting region C, wherein an orthographic projection of the second reflecting sublayer 11 on the mother-board substrate 400 is located within the device region A and the cutting region C.

In some embodiments, in some embodiments, referring to FIG. 10, the first reflecting sublayer 10 covers the edge of the substrate 1, and the second reflecting sublayer 11 contracts inwardly toward the device region A, whereby the range of the distance H1 between the edge of the second reflecting sublayer 11 and the edge of the substrate 1 (the cutting line) is controlled to be between 0.2-2 mm.

As an example, the distance H1 between the edge of the second reflecting sublayer 11 and the edge of the substrate 1 may be 0.2 mm, 0.4 mm, 0.5 mm, 0.8 mm, 1 mm, 1.5 mm, 1.8 mm or 2 mm. The particular numerical value of the distance H1 between the edge of the second reflecting sublayer 11 and the edge of the substrate 1 may be decided according to the different configurations of the array base plate and according to the different fabricating processes or cutting processes of the array base plate, and is not limited herein.

In some embodiments, the materials of the first reflecting sublayer 10 and the second reflecting sublayer 11 may be different. For example, the material of the first reflecting sublayer 10 may comprise a white ink, and the material of the second reflecting sublayer 11 may comprise a silicon-based white glue. Alternatively, the materials of the first reflecting sublayer 10 and the second reflecting sublayer 11 may be the same. For example, both of the materials of the first reflecting sublayer 10 and the second reflecting sublayer 11 comprise a white ink. When the materials of the first reflecting sublayer 10 and the second reflecting sublayer 11 comprise a white ink or comprise a silicon-based white glue, the first reflecting sublayer 10 and the second reflecting sublayer 11 may be formed by printing by using a screen-printing process.

As an example, the range of the thickness of the first reflecting sublayer 10 may be 25 μm-35 μm, for example, 25 μm, 28 μm, 30 μm, 32 μm or 35 μm.

As an example, the range of the thickness of the second reflecting sublayer 11 may be 25 μm-35 μm, for example, 25 μm, 28 μm, 30 μm, 32 μm or 35 μm.

In some embodiments of the present application, after the step of bonding the plurality of devices 12 within the device region A of the mother-board substrate 400, and before the step of cutting at the back side of the mother-board substrate 400 along the cutting line, to obtain at least one array base plate, the method further comprises:

forming an auxiliary reflecting part 13 on the inter-layer-medium layer 30, wherein the auxiliary reflecting part 13 is connected to the reflecting layer 20.

In some embodiments, if the reflecting layer 20 is fabricated by multiple times of screen printing, the reflecting layer 20 at the edges of the hollow region L may be of a step shape, and the reflecting layer 20 at the edges of the hollow region L exposes part of the inter-layer-medium layer 30. In this case, the auxiliary reflecting part 13 may be subsequently provided on the inter-layer-medium layer 30, to cover part of the inter-layer-medium layer 30 exposed by the reflecting layer 20 at the edges of the hollow region L, which solves the problem that part of the inter-layer-medium layer 30 is not covered by the reflecting layer 20, so as to further increase the light-emission amount of the array base plate in the direction perpendicular to the plane where the substrate 1 is located, thereby increasing the luminous efficiency of the array base plate.

In some embodiments, the provision of the auxiliary reflecting part 13 at the side wall of the hollow region L of the reflecting layer 20 can reduce the radial dimension of the hollow region L, and increase the size precision of the hollow region L.

It should be noted that the auxiliary reflecting part 13 may be fabricated by spray coating around the edge of the hollow region. Furthermore, referring to FIG. 2*b*, the distance T2 between the surface of the auxiliary reflecting part 13 that contacts the inter-layer-medium layer 30 and the surface of the auxiliary reflecting part 13 that is further from the inter-layer-medium layer 30 is greater than the distance T1 between the surface of the reflecting layer 20 that contacts the inter-layer-medium layer 30 and the surface of the reflecting layer 20 that is further from the inter-layer-medium layer 30.

In some embodiments, the material of the auxiliary reflecting part 13 comprises a silicon-based white glue, and the color of the silicon-based white glue is the white color, whereby the color of the auxiliary reflecting part 13 is substantially the same as the color of the reflecting layer 20, to ensure that the reflectivity of the auxiliary reflecting part 13 to light rays is close to the reflectivity of the reflecting layer 20 to light rays.

Figure 17A:
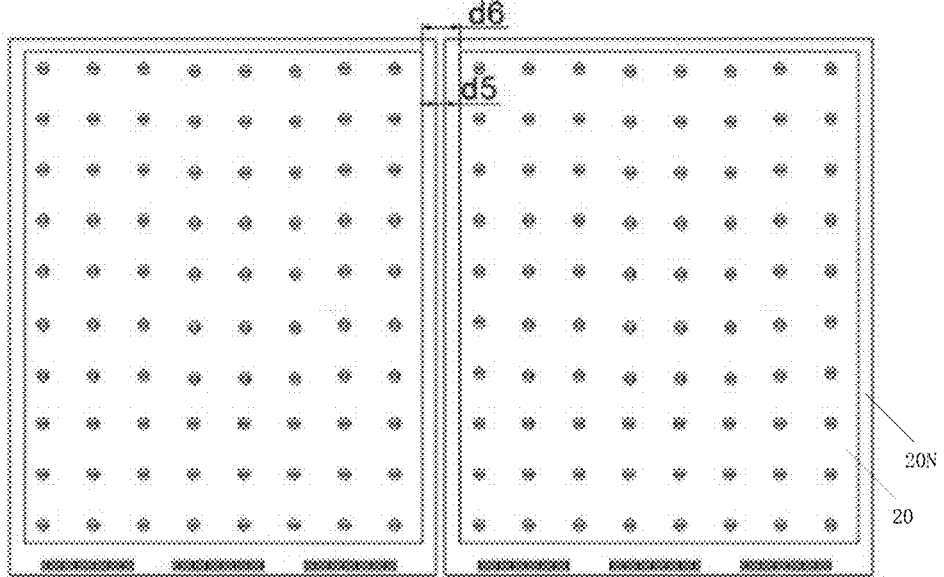
FIG. 17a is a schematic structural diagram of a spliced displaying apparatus in the related art.
Figure 17B:
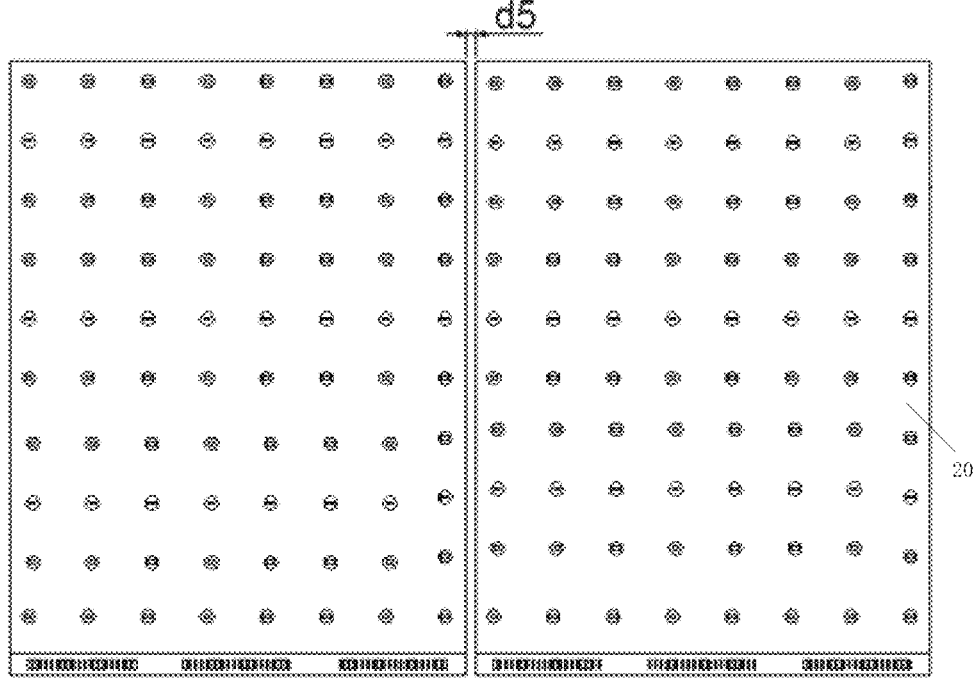
FIG. 17b is a schematic structural diagram of a spliced displaying apparatus according to an embodiment of the present application.

The embodiments of the present application provide schematic structural diagrams of spliced displaying apparatuses formed by array base plates cut by using the front cutting process and the back cutting process. FIG. 17a shows a schematic structural diagram of a spliced displaying apparatus formed by an array base plate cut by using the front cutting process. FIG. 17b shows a schematic structural diagram of a spliced displaying apparatus formed by an array base plate cut by using the back cutting process.

In the spliced displaying apparatus shown in FIG. 17a, the array base plates forming the light emitting apparatuses are obtained by using the front cutting process. The region of the light emitting apparatuses that is not provided with the reflecting layer is marked as 20N. The spliced displaying apparatus comprises two light emitting apparatuses. In each of the light emitting apparatuses, the distance from the edge of the reflecting layer 20 to the edge of the light emitting apparatus is 0.7 mm, and the width d5 of the seam of the spliced displaying apparatus is =0.9 mm, whereby the width d6 of the region between the two neighboring light emitting apparatuses that is not provided with the reflecting layer is =d5+0.7 mm*2=2.3 mm. In other words, the distance between the displaying regions of the two neighboring light emitting apparatuses in the spliced displaying apparatus is 2.3 mm, and when the spliced displaying apparatus is displaying a frame, a region of the width of 2.3 mm exists that does not display the frame (the non-displaying region), which seriously deteriorates the effect of displaying of the spliced displaying apparatus.

In the spliced displaying apparatus shown in FIG. 17b, the array base plates forming the light emitting apparatuses are obtained by using the back cutting process. The spliced displaying apparatus comprises two light emitting apparatuses. In each of the light emitting apparatuses, each of the light emitting apparatuses used for the splicing does not have a region that does not have the reflecting layer, whereby the width d6 of the region between the two neighboring light emitting apparatuses that is not provided with the reflecting layer is d6=d5=0.9 mm. As compared with the spliced displaying apparatus obtained by using the front cutting process, the two neighboring light emitting apparatuses in the spliced displaying apparatus obtained by using the back cutting process have a smaller non-displaying region therebetween, thereby improving the effect of displaying of the spliced displaying apparatus to a large extent.

The above are merely particular embodiments of the present application, and the protection scope of the present application is not limited thereto. All of the variations or substitutions that a person skilled in the art can easily envisage within the technical scope disclosed by the present application should fall within the protection scope of the present application. Therefore, the protection scope of the present application should be subject to the protection scope of the claims.

The invention claimed is:

1. An array base plate, wherein the array base plate comprises:
   a device region; and
   a peripheral region adjacent to the device region;
   both of the device region and the peripheral region comprise a substrate and a reflecting layer located on the substrate;
   the device region further comprises an inter-layer-medium layer and a plurality of devices, and the inter-layer-medium layer is located at least between the substrate and the reflecting layer;
   the reflecting layer has a plurality of hollow regions in a direction perpendicular to the substrate, and the devices are located within the hollow regions;
   an orthographic projection on the substrate of a part of the reflecting layer that is located within the device region and an orthographic projection of the inter-layer-medium layer on the substrate partially overlap, a part of the reflecting layer that is located within the peripheral region covers a part of the substrate that is located within the peripheral region, and an outer contour of the substrate and an outer contour of the peripheral region are the same; and
   the devices include at least a light emitting device;
   wherein the array base plate further comprises an auxiliary reflecting part; the auxiliary reflecting part is located on the inter-layer-medium layer, and the auxiliary reflecting part is connected to the reflecting layer.

2. The array base plate according to claim 1, wherein the reflecting layer comprises a first reflecting sublayer and a second reflecting sublayer, and the second reflecting sublayer is located on one side of the first reflecting sublayer that is further from the substrate;
   an orthographic projection of the first reflecting sublayer on the substrate is located within the device region and the peripheral region;
   an orthographic projection on the substrate of a part of the first reflecting sublayer that is located within the device region and the orthographic projection of the inter-layer-medium layer on the substrate partially overlap, and the first reflecting sublayer covers the part of the substrate that is located within the peripheral region; and
   an orthographic projection of the second reflecting sublayer on the substrate is located within the orthographic projection of the first reflecting sublayer on the substrate.

3. The array base plate according to claim 2, wherein the orthographic projection of the second reflecting sublayer on the substrate is located within the device region; and
   the orthographic projection of the second reflecting sublayer on the substrate and an orthographic projection on the substrate of a part of the first reflecting sublayer that is located within the peripheral region do not overlap.

4. The array base plate according to claim 2, wherein an orthographic projection of the second reflecting sublayer on the substrate is located within the peripheral region and the device region; and
   an orthographic projection on the substrate of a part of the second reflecting sublayer that is located within the peripheral region and an orthographic projection on the substrate of a part of the first reflecting sublayer that is located within the peripheral region overlap.

5. The array base plate according to claim 2, wherein the first reflecting sublayer and the second reflecting sublayer have equal thicknesses in the direction perpendicular to the substrate.

6. The array base plate according to claim 1, wherein the auxiliary reflecting part comprises a first reflecting part and a second reflecting part, and the first reflecting part and the second reflecting part are of an integral structure;
   the hollow regions expose part of area of the inter-layer-medium layer, an orthographic projection of the first reflecting part on the substrate is located within the hollow regions, and the first reflecting part directly contacts the inter-layer-medium layer; and
   the second reflecting part directly contacts a surface of the reflecting layer that is further from the substrate, and an orthographic projection of the second reflecting part on the substrate overlaps with an orthographic projection of the reflecting layer on the substrate.

7. The array base plate according to claim 1, wherein the array base plate further comprises a plurality of packaging units corresponding to the devices, orthographic projections of the packaging units on the substrate cover orthographic projections of the devices on the substrate, and the ortho-graphic projections of the packaging units on the substrate partially overlap with an orthographic projection of the reflecting layer on the substrate.

8. The array base plate according to claim 1, wherein the device region of the array base plate further comprises a buffer layer and a first electrically conductive layer that are sequentially arranged on the substrate, and the inter-layer-medium layer is located on one side of the first electrically conductive layer that is further from the substrate; and
   the inter-layer-medium layer comprises a first insulating layer and a first planarization layer, and the first pla-narization layer is located at least between the first insulating layer and the reflecting layer.

9. The array base plate according to claim 8, wherein the device region of the array base plate further comprises a second electrically conductive layer, a second insulating layer, a second planarization layer and a third insulating layer that are arranged sequentially in stack on the buffer layer, and the third insulating layer is located on one side of the first electrically conductive layer that is further from the first insulating layer.

10. The array base plate according to claim 8, wherein the first electrically conductive layer comprises at least one first bonding pad and at least one second bonding pad, the inter-layer-medium layer has at least one first opening and at least one second opening in the direction perpendicular to the substrate, the first opening exposes a region where the first bonding pad is located, and the second opening exposes a region where the second bonding pad is located; and
   the first bonding pad is electrically connected to a first weld leg of one of the devices by the first opening, and the second bonding pad is electrically connected to a second weld leg of the device by the second opening.

11. The array base plate according to claim 10, wherein the array base plate further comprises a plurality of support-ing columns, the supporting columns are located on one side of the reflecting layer that is further from the substrate, and orthographic projections of the supporting columns on the substrate and orthographic projections of the devices on the substrate do not overlap.

12. A light emitting apparatus, wherein the light emitting apparatus comprises the array base plate according to claim 1.

13. The light emitting apparatus according to claim 12, wherein the light emitting apparatus further comprises a diffuser plate, a quantum-dot film, a diffuser sheet and a composite film that are arranged sequentially in stack; and
   the diffuser plate is located on a light exiting side of the array base plate.

14. A spliced displaying apparatus, wherein the spliced displaying apparatus comprises at least two instances of the light emitting apparatus according to claim 12.

15. A method for fabricating an array base plate, wherein the method is applied to fabricating the array base plate according to claim 1, and the method comprises:
   providing a mother-board substrate, wherein the mother-board substrate is delimited into at least one device region and a cutting region adjacent to the device region;
   forming the inter-layer-medium layer within the device region of the mother-board substrate;
   forming the reflecting layer within the device region and the cutting region of the mother-board substrate, wherein the reflecting layer has a plurality of hollow regions in a direction perpendicular to the mother-board substrate; the inter-layer-medium layer is located at least between the mother-board substrate and the reflecting layer; and an orthographic projection on the mother-board substrate of the part of the reflecting layer that is located within the device region and an orthographic projection of the inter-layer-medium layer on the mother-board substrate partially overlap, and a part of the reflecting layer that is located within the cutting region covers the cutting region of the mother-board substrate;
   bonding the plurality of devices within the device region of the mother-board substrate, wherein the devices are located within the hollow regions; and
   cutting at a back side of the mother-board substrate along a cutting line, to obtain at least one instance of the array base plate, wherein the cutting line is located within the cutting region, and the back side refers to a surface of the mother-board substrate that is further from the devices;
   wherein after the step of bonding the plurality of devices within the device region of the mother-board substrate, and before the step of cutting at the back side of the mother-board substrate along the cutting line, to obtain at least one instance of the array base plate, the method further comprises:
   forming an auxiliary reflecting part on the inter-layer-medium layer, wherein the auxiliary reflecting part is connected to the reflecting layer.

16. The method for fabricating an array base plate accord-ing to claim 15, wherein after the step of cutting at the back side of the mother-board substrate along the cutting line, to obtain at least one instance of the array base plate, the method further comprises:
   grinding an edge of the array base plate by using a perpendicular grinding technique.

17. The method for fabricating an array base plate accord-ing to claim 16, wherein the step of grinding the edge of the array base plate by using the perpendicular grinding tech-nique comprises:
   in a direction perpendicular to the array base plate, grinding a side of the substrate and a side of the reflecting layer of the array base plate simultaneously, wherein the side of the substrate and the side of the reflecting layer are coplanar.

18. The method for fabricating an array base plate according to claim 15, wherein the step of forming the reflecting layer within the device region and the cutting region of the mother-board substrate comprises:

forming a first reflecting sublayer, wherein an orthographic projection of the first reflecting sublayer on the mother-board substrate is located within the device region and the cutting region; and forming a second reflecting sublayer, wherein an orthographic projection of the second reflecting sublayer on the mother-board substrate is located within the device region;

or forming a first reflecting sublayer, wherein an orthographic projection of the first reflecting sublayer on the mother-board substrate is located within the device region and the cutting region; and forming a second reflecting sublayer, wherein an orthographic projection of the second reflecting sublayer on the mother-board substrate is located within the device region and the cutting region.

\*    \*    \*    \*    \*